(12) United States Patent
Naiini et al.

(10) Patent No.: US 7,220,520 B2
(45) Date of Patent: May 22, 2007

(54) PHOTOSENSITIVE RESIN COMPOSITIONS

(75) Inventors: Ahmad A. Naiini, East Greenwich, RI (US); David B. Powell, Minnetonka, MN (US); N. Jon Metivier, Billerica, MA (US); Il'ya Rushkin, Billerica, MA (US); Richard Hopla, Cranston, RI (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 0 days.

(21) Appl. No.: 11/445,764

(22) Filed: Jun. 2, 2006

(65) Prior Publication Data

US 2006/0275699 A1   Dec. 7, 2006

Related U.S. Application Data

(60) Provisional application No. 60/687,434, filed on Jun. 3, 2005.

(51) Int. Cl.
    G03F 7/023    (2006.01)
    G03F 7/30     (2006.01)

(52) U.S. Cl. .................. 430/18; 430/190; 430/191; 430/192; 430/193; 430/270.1; 430/280.1; 430/326; 430/330

(58) Field of Classification Search .................. 430/18, 430/190, 191, 192, 193, 270.1, 280.1, 326, 430/330
See application file for complete search history.

(56) References Cited

U.S. PATENT DOCUMENTS

| | | | |
|---|---|---|---|
| 3,645,772 A | 2/1972 | Jones | 430/159 |
| 3,873,316 A | 3/1975 | Velten et al. | 420/41 |
| 5,434,031 A * | 7/1995 | Nakao et al. | 430/191 |
| 5,496,590 A | 3/1996 | Maki et al. | 427/96.2 |
| 6,001,517 A * | 12/1999 | Kawamonzen | 430/18 |
| 6,177,225 B1 * | 1/2001 | Weber et al. | 430/190 |
| 6,214,516 B1 * | 4/2001 | Waterson et al. | 430/191 |

FOREIGN PATENT DOCUMENTS

JP        09325480    12/1997

OTHER PUBLICATIONS

Studies of polyimide/copper interface and its improvement by a two-component primer, Dong, Jian, et al. Department Polymer Science and Engineering, Nanjing University, Nanjing, 210093, Peop. Rep. China, Huethig & Wepf, pp. 143-157, 1995.
The formation of an effective anti-corrosion film on copper surfaces from 2-mercaptobenzimidazole solution, Xue, Gi et al., Dep. Chem., Nanjing Univ., Nanjing, 210008, Peop. Rep. China, Journal of Electroanalytical Chemistry and Interfacial Electrochemistry, pp. 139-148, 1991.

* cited by examiner

Primary Examiner—John S. Chu
(74) Attorney, Agent, or Firm—Ohlandt, Greeley, Ruggiero & Perle, LLP

(57) ABSTRACT

A photosensitive resin composition comprising:
  (d) at least one polybenzoxazole precursor polymer
  (e) at least one compound having structure VI

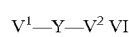

wherein Y is selected from S, O, $NR^2$, $(HOCH)_p$, and

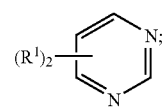

each $R^1$ is selected H, an alkyl group, an alkenyl group, an alkynyl group, an alkoxy group or a halogen, each $R^2$ is selected from H, SH, $CH_3$, $C_2H_5$, and a linear or branched $C_1$–$C_4$ alkyl group containing a thiol group; p is an integer of from 1 to 4, and wherein $V^1$ and $V^2$ are independently selected from the group consisting of

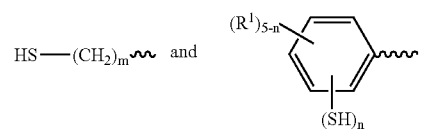

wherein, m is independently an integer from 0 to 4 with the proviso that m=0 only when Y=

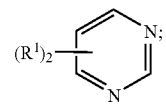

n is an integer from 1 to 5; and each $R^1$ is defined as above; and
  (f) at least one solvent;
wherein the amount of the compound of Structure VI present is an amount effective to inhibit residue from forming when the composition is coated on a substrate and the substrate is subsequently processed to form an image, and with the proviso that if the polybenzoxazole precursor polymer solely consists of polybenzoxazole precursor polymers that do not contain a photoactive moiety on the polymer, then
  (d) at least one photoactive compound is also present in the composition.

18 Claims, No Drawings

PHOTOSENSITIVE RESIN COMPOSITIONS

RELATED APPLICATIONS

This application claims priority from U.S. Provisional Patent Application No. 60/687,434, filed Jun. 3, 2005.

FIELD OF THE INVENTION

The present invention relates to buffer coat resin compositions. More specifically, the present invention relates to positive tone photosensitive compositions, a process of use for said compositions, and electronic parts produced by said process of use.

BACKGROUND OF THE INVENTION

In microelectronic applications, polymers that demonstrate high temperature resistance such as polyimides and polybenzoxazoles are generally well known. Precursors of such polymers can be made photoreactive with suitable additives. The precursors are converted to the desired polymer by known techniques such as exposure to high temperatures. The polymer precursors are used to prepare protective layers, insulating layers, and relief structures of highly heat-resistant polymers.

As the dimension of the photolithographic pattern on a wafer continues to shrink below 0.18 microns, greater demands are placed on lithographic equipment and materials. To meet this challenge, the semiconductor industry is changing from aluminum based alloys and silicon dioxide to copper metal and low dielectric constant (low-k) materials to manufacture chips. When using the new low-k dielectrics there is a decrease in capacitance, which is critical to improving integrated circuit performance, especially for higher density memory chips. Copper is known to have as much as 40% decreased electrical resistance, carries higher current densities, and has improved electromigration resistance compared to aluminum. Thus, copper interconnects allow decreasing transistor size and shorter wire lengths that result in faster, more powerful devices.

Copper metallization provides challenges to the coatings industry since copper can act as a catalyst and destabilize systems that are optimized for coating over aluminum. In addition, cuprous and cupric ions present on the copper surface can bind strongly with some polymers and reduce the ability to dissolve off the polymers during certain wafer processes. This results in the presence of some residue on copper surfaces after it is coated by a photosensitive composition, softbaked, exposed and developed. The residue adversely affects adhesion of the overlying structures to the Cu, and without good adhesion, non-adherent oxides can form resulting in device failure. With the increased use of copper metallization in semiconductor devices, it is important to develop coating systems that are compatible with copper and copper processing.

Conventional positive-working photosensitive polybenzoxazole (PBO) compositions contain an alkaline soluble PBO precursor and a diazoquinone photoactive compound (PAC) as disclosed in U.S. Pat. No. 4,339,521, U.S. Pat. No. 4,371,685, U.S. Pat. No. 4,849,051, and U.S. Pat. No. 5,376,499. The diazoquinone compound inhibits the solubility of PBO precursor in an aqueous base. However after exposure to light, the diazoquinone compound undergoes photolysis and converts to indene carboxylic acid, which promotes solubility of the PBO precursor in the aqueous base. U.S. Pat. No. 5,037,720 disclosed a positive-working photosensitive polybenzoxazole composition containing an alkaline soluble PBO precursor in which part of OH groups were substituted with a diazoquinone moiety. In this case no PAC was used in the composition. U.S. Pat. No. 6,177,225 and U.S. Pat. No. 6,214,516 disclosed compositions containing both PBO precursor in which part of the OH groups were substituted by diazoquinone moiety and PAC.

SUMMARY OF THE INVENTION

The present invention is directed to a photosensitive resin composition comprising:
(a) at least one polybenzoxazole precursor polymer
(b) at least one compound having structure VI $$V^1\text{—}Y\text{—}V^2 \qquad\qquad VI$$

wherein Y is selected from the group consisting of S, O, $NR^2$, $(HOCH)_p$, and

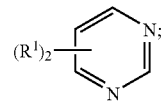

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$–$C_4$ alkyl group containing a thiol group; p is an integer of from 1 to 4, and wherein $V^1$ and $V^2$ are independently selected from the group consisting of

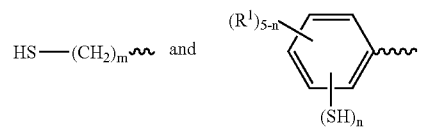

wherein, m is independently an integer from 0 to 4 with the proviso that m=0 only when Y=

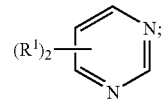

n is an integer from 1 to 5; and each $R^1$ is defined as above; and
(c) at least one solvent;
wherein the amount of the compound of Structure VI present in the composition is an amount effective to inhibit residue from forming when the composition is coated on a substrate and the coated substrate is subsequently processed to form an image on the substrate, and with the proviso that if the polybenzoxazole precursor polymer solely consists of polybenzoxazole precursor polymers that do not contain a photoactive moiety on the polymer, then
(d) at least one photoactive compound is also present in the composition.

The present invention also concerns a process for forming a relief pattern and electronic parts using the composition.

DETAILED DESCRIPTION OF THE INVENTION

The present invention is directed to photosensitive resin compositions comprising:
(a) at least one polybenzoxazole precursor polymer;
(b) at least one compound having structure VI

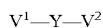   VI wherein Y is selected from the group consisting of S, O, $NR^2$, $(HOCH)_p$, and

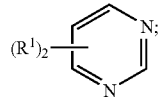

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$–$C_4$ alkyl group containing a thiol group; p is an integer of from 1 to 4, and wherein $V^1$ and $V^2$ are independently selected from the group consisting of

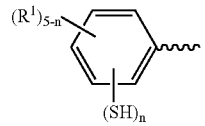

wherein, m is independently an integer from 0 to 4 with the proviso that m=0 only when Y=

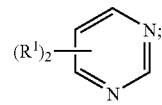

n is an integer from 1 to 5; and each $R^1$ is defined as above; and
(c) at least one solvent.
wherein the amount of the compound of Structure VI present in the composition is an amount effective to inhibit residue from forming when the composition is coated on a substrate and the coated substrate is subsequently processed to form an image on the substrate, and with the proviso that if the polybenzoxazole precursor polymer solely consists of polybenzoxazole precursor polymers that do not contain a photoactive moiety in the polymer, then
(d) at least one photoactive compound is also present in the composition.

One embodiment of the present invention is directed to a positive photosensitive resin composition comprising:
(a) at least one polybenzoxazole precursor polymer having Structure I or II or III or III* or IV or IV* or V.

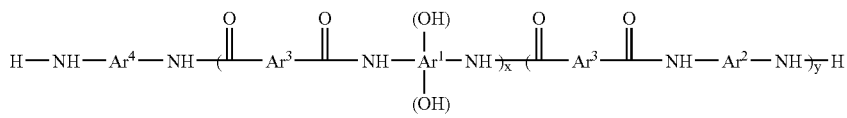

I

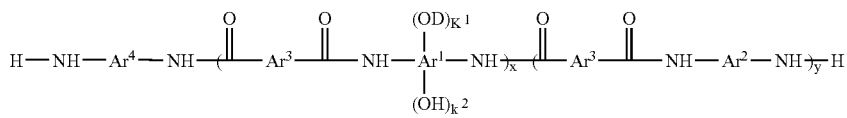

II

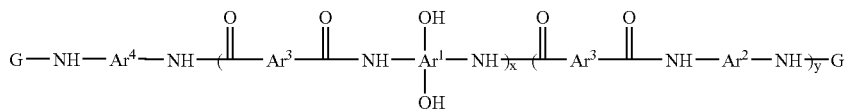

III

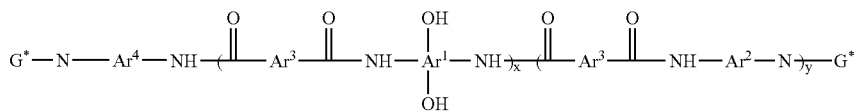

III*

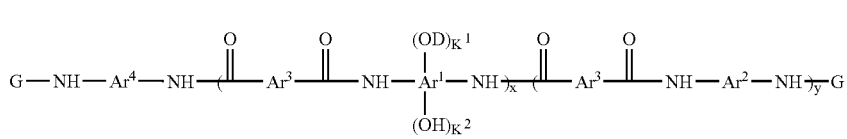

IV

-continued

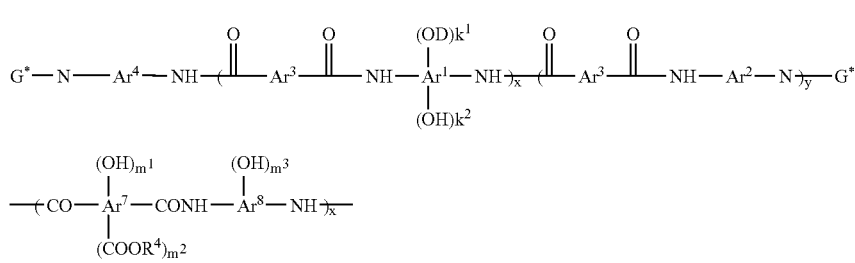

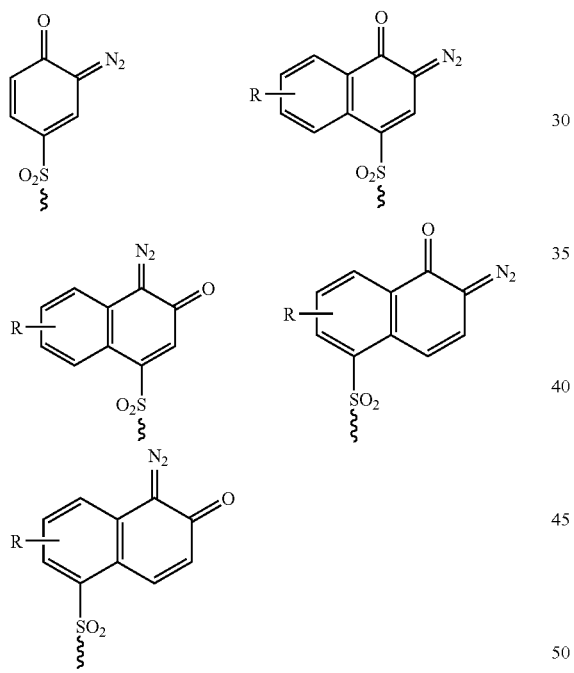

wherein Ar¹ is a tetravalent aromatic group, a tetravalent heterocyclic group, or mixtures thereof; Ar² is a divalent aromatic, a divalent heterocyclic, a divalent alicyclic, or a divalent aliphatic group that may contain silicon; Ar³ is a divalent aromatic group, a divalent aliphatic group, a divalent heterocyclic group, or mixtures thereof; Ar⁴ is Ar¹ (OH)$_2$ or Ar², x is from about 10 to about 1000; y is from 0 to about 900; D is one of the following moieties:

wherein, R is H, halogen, a $C_1$–$C_4$ alkyl group, a $C_1$–$C_4$ alkoxy group, cyclopentyl, or cyclohexyl; $k^1$ can be any positive value of up to about 0.5, $k^2$ can be any value from about 1.5 to about 2 with the proviso that ($k^1$+$k^2$)=2, G is a monovalent organic group having a carbonyl, carbonyloxy or sulfonyl group; G* is a divalent organic group having at least one carbonyl or sulfonyl group; Ar⁷ represents a bivalent to octavalent organic group with at least two carbon atoms, Ar⁸ represent a bivalent to hexavalent organic group with at least two carbon atoms, and R⁴ represent hydrogen or an organic group with 1 to 10 carbons, $m^1$ and $m^3$ are integers in the range of 0 to 4 but $m^1$ and $m^3$ cannot be simultaneously 0 and $m^2$ is an integer in the range of 0 to 2;

(b) at least one compound having structure VI $$V^1\text{—}Y\text{—}V^2 \qquad \qquad VI$$

wherein Y is selected from the group consisting of S, O, NR², (HOCH)$_p$, and

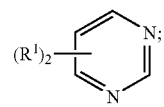

each R¹ is independently selected from the group consisting of H, an alkyl group, an alkenyl group, an alkynyl group, an alkoxy group or a halogen, each R² is independently selected from the group consisting of H, SH, $CH_3$, $C_2H_5$, and a linear or branched $C_1$–$C_4$ alkyl group containing a thiol group; p is an integer of from 1 to 4, and wherein $V^1$ and $V^2$ are independently selected from the group consisting of

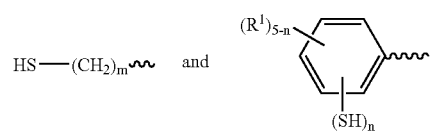

wherein, m is independently an integer from 0 to 4 with the proviso that m=0 only when Y=

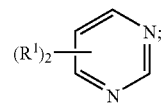

n is an integer from 1 to 5; and each R¹ is defined as above; and (c) at least one solvent, with the proviso that if the polybenzoxazole precursor polymer solely consists of Structure I or III or V or a mixture containing any of the three, then (d) at least one photoactive compound is added.

The polymers of Structure I can be prepared from monomers having Structures X, XI and XII. Monomers having Structures X, XI and XII are reacted in the presence of a base to synthesize polybenzoxazole precursor polymers of Structure I.

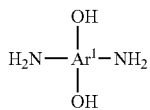  X

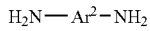  XI

  XII

Ar¹, Ar², Ar³ are as previously defined, and W is C(O)Cl, COOH or C(O)OR¹² and wherein R¹² is a $C_1$–$C_7$ linear or branched alkyl group or a $C_5$–$C_8$ cycloalkyl group.

In Structures I, II, III, III*, IV, IV* and X, Ar¹ is a tetravalent aromatic or a tetravalent heterocyclic group. Examples of Ar¹ include, but are not limited to:

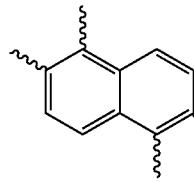
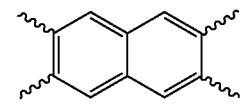
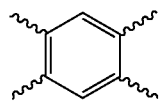 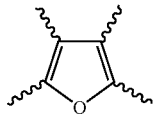 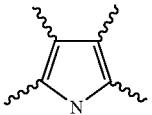

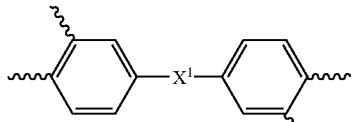

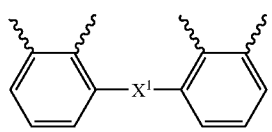

wherein $X^1$ is —O—, —S—, —C(CF₃)₂—, —C(CH₃)₂—, —CH₂—, —SO₂—, —NHCO— or —SiR¹³₂— and each R¹³ is independently a $C_1$–$C_7$ linear or branched alkyl or $C_5$–$C_8$ cycloalkyl group. Examples of R¹³ include, but are not limited to, —CH₃, —C₂H₅, n-C₃H₇, i-C₃H₇, n-C₄H₉, t-C₄H₉, and cyclohexyl.

Examples of monomers having the Structure X containing Ar¹ include, but are not limited to, 2,2-bis(3-amino4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure X may be any of the possible substitution patterns with the proviso that the each amino group has an ortho relationship with a hydroxyl group in order to be able to form the benzoxazole ring. Furthermore, the polybenzoxazole precursor base polymer may be synthesized using a mixture of two or more monomers described by generic Structure X.

In Structures I, II, III, III*, IV, IV*, and XI, Ar² is a divalent aromatic, a divalent heterocyclic, a divalent alicyclic, or a divalent aliphatic group that may contain silicon. Examples of Ar² include, but are not limited to:

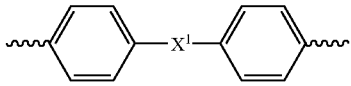

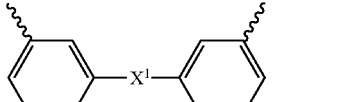

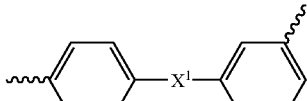

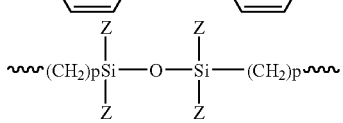

wherein $X^1$ is —O—, —S—, —C(CF₃)₂—, —C(CH₃)₂—, —CH₂—, —SO₂—, —NHCO— or —SiR¹³₂— and each R¹³ is independently a $C_1$–$C_7$ linear or branched alkyl or $C_5$–$C_8$ cycloalkyl group, $X^2$ is —O—, —S—, —C(CF₃)₂—, —C(CH₃)₂—, —CH₂—, —SO₂—, or —NHCO—, Z=H or $C_1$–$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl and cyclooctyl.

Examples of monomers having the Structure XI containing Ar² include, but are not limited to, 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 2,4-toluenediamine, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy) benzene, 1,3-bis (3-amino-phenoxy)benzene, 1,4-bis(gamma-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline). Furthermore, the polybenzoxazole precursor base polymer may be synthesized using a mixture of two or more monomers described by generic Structure XI.

In Structures I, II, III, III*, IV, IV*, and XII, $Ar^3$ is a divalent aromatic, a divalent aliphatic, or a divalent heterocyclic group. Examples of $Ar^3$ include, but are not limited to:

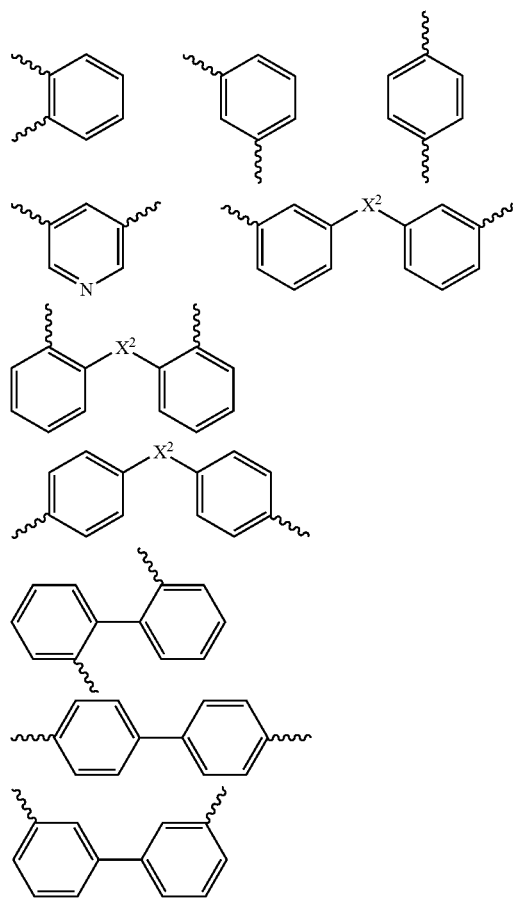

wherein $X^2$ is —O—, —S—, —C(CF$_3$)$_2$—, —C(CH$_3$)$_2$—, —CH$_2$—, —SO$_2$—, or —NHCO—.

In Structure XII, W is C(O)Cl, COOH or C(O)OR$^{12}$ wherein $R^{12}$ is $C_1$–$C_7$ linear or branched alkyl group or a $C_5$–$C_8$ cycloalkyl group. Examples of $R^{12}$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Monomers having the Structure XII are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terephthaloyl dichloride, 1,4-oxydibenzoyl chloride and mixtures thereof. Examples of suitable dicarboxylic esters (W=C(O)OR$^{12}$) include, but are not limited to, dimethyl isophthalate, dimethyl phthalate, dimethyl terephthalate, diethyl isophthalate, diethyl phthalate, diethyl terephthalate and mixtures thereof.

Monomers having Structures X and XI and XII react to produce a polybenzoxazole precursor polymer of Structure I. Any conventional method for reacting a dicarboxylic acid or its dichloride or diester with at least one aromatic and/or heterocyclic dihydroxydiamine, and optionally, with at least one diamine, may be used. Generally, the reaction for diacid dichlorides (W↑C(O)Cl) is carried out at about –10° C. to about 30° C. for about 6 to about 48 hours in the presence of an approximately stoichiometric amount of a mine base. Examples of suitable a mine bases include, but are not limited to, pyridine, triethylamine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor polymer of Structure I may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having Structure X, XI, and XII are employed such that the ratio of [X+XI]/XII is generally from about 1 to about 1.2. Preferably, the ratio of [X+XI]/XII is generally from about 1 to about 1.1. The monomer having the Structure X is employed from about 10 to about 100 mole % of [X+XI] and the monomer having Structure XI is employed from about 0 to about 90 mole % of [X+XI]. Distribution of the polymeric units resulting from monomers having the Structures X and XI in the polybenzoxazole precursor base polymer may be random or in blocks.

In Structures I, II, III, III*, IV or IV* x is an integer from about 10 to about 1000, y is an integer from about 0 to about 900 and (x+y) is less than about 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

It should be noted that molecular weight and inherent viscosity of the polymers and therefore, x and y at a constant stoichiometry, can have a wide range depending on the reaction conditions chosen and considerations such as the purity of the solvent, the humidity, presence or absence of a blanket of nitrogen or argon gas, reaction temperature, reaction time, and other variables.

Polybenzoxazole precursor polymer of Structure II may be synthesized by reaction of the polybenzoxazole precursor polymer of Structure I with about 0.5% to about 25 mole % of a diazoquinone (based on the number of OH groups from the monomer of Structure I) in the presence of a base to yield the polybenzoxazole precursor of Structure II according to Reaction 1.

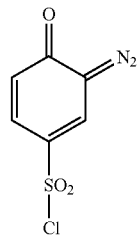

wherein, R is H, a halogen, a $C_1$–$C_4$ alkyl group, a $C_1$–$C_4$ alkoxy group, cyclopentyl or cyclohexyl. Examples of suitable R groups include, but are not limited to, methyl, ethyl, propyl, iso-propyl, n-butyl, sec-butyl, t-butyl, cyclopentyl or cyclohexyl.

Reaction 1

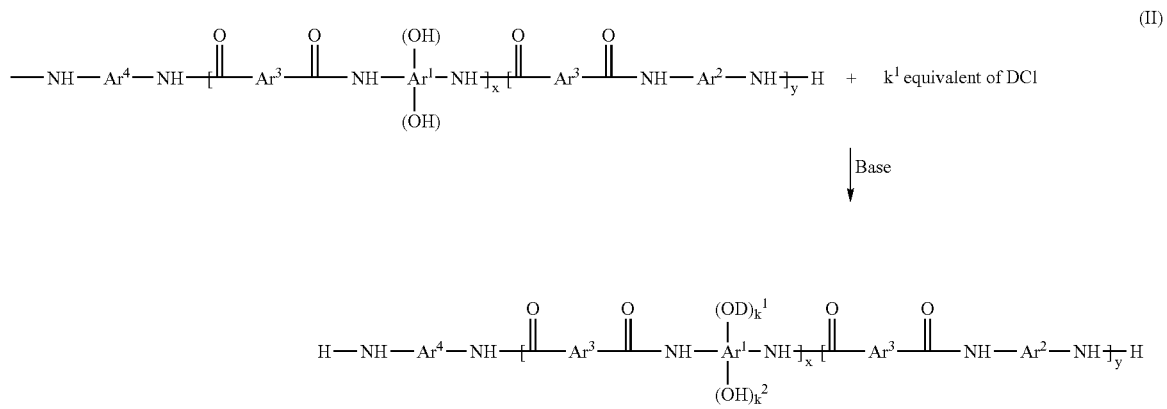

wherein $Ar^1$, $Ar^2$, $Ar^3$, $Ar^4$, D, $k^1$, $k^2$, x and y are as previously defined Examples of the diazoquinone compound DCI that can be reacted with the PBO polymer I include, but are not limited to, one of the following:

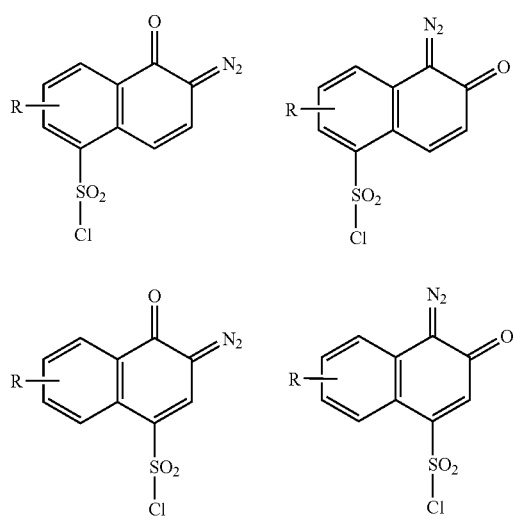

Generally, the reaction is carried out at about 0° C. to about 30° C. for about 3 to about 24 hours in a solvent in the presence of a base. Generally, a slight excess of base to DCI is employed. Examples of bases include, but are not limited to, amine bases such as pyridine, trialkylamine, methylpyridine, lutidine, n-methylmorpholine, and the like. The most preferred base is triethylamine. The preferred reaction solvents are tetrahydrofuran, acetone, N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred reaction solvents are tetrahydrofuran and acetone. The reaction mixture should be protected from actinic rays.

The molar amount of DCI may range from about 0.5% to about 25% of the quantity of OH groups from monomers of Structure X to yield $k^1$ from 0.01 to about 0.5. A preferred amount of DCI is from about 0.5% to about 10% of the quantity of OH groups from monomers of Structure X to produce $k^1$ from about 0.01 to about 0.20. A more preferred amount of DCI is from about 0.5% to about 5% of the quantity of OH groups from monomers of Structure X to produce $k^1$ from about 0.01 to about 0.10. A most preferred amount of DCI is from about 0.5% to about 2.5% of the quantity of OH groups from monomers of Structure X to produce $k^1$ from about 0.01 to about 0.05.

Polybenzoxazole precursor polymers of Structure III:

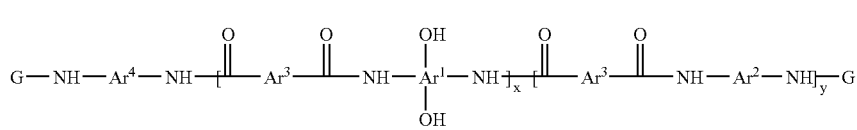

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OH)_2$ or $Ar^2$ and G is a monovalent organic group having a carbonyl, carbonyloxy or sulfonyl group may be synthesized by reaction of polybenzoxazole polymer of Structure I with G-M where G is a monovalent organic group having a carbonyl, carbonyloxy or sulfonyl group and M is a reactive leaving group. Examples of G include, but are not limited to, the following structures:

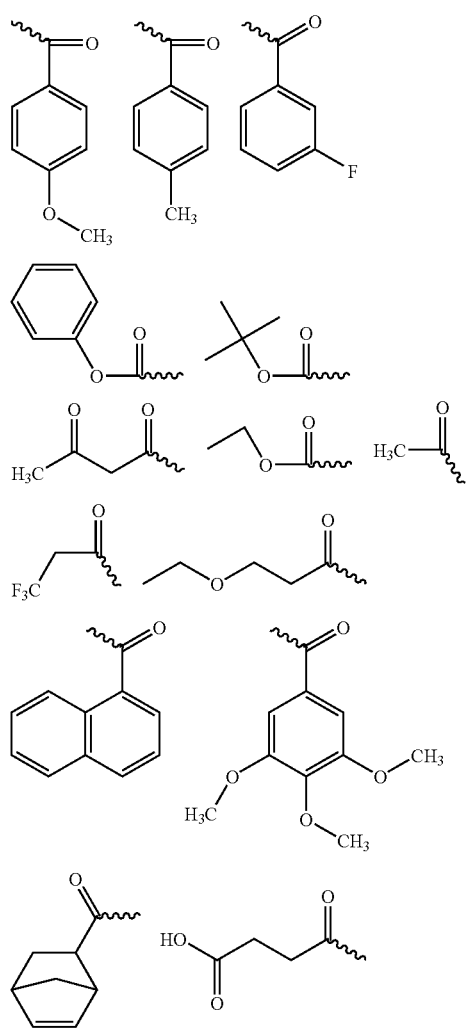

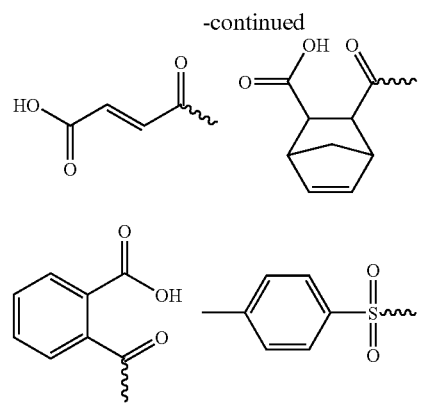

Examples of M groups include, but are not limited to, Cl, Br, mesylate, triflate, substituted carbonyloxy groups, and substituted carbonate groups.

Examples of suitable classes of G-M compounds include but are not limited to, carbon and sulfonic acid chlorides, carbon and sulfonic acid bromides, linear and cyclic carbon and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the Structures shown below.

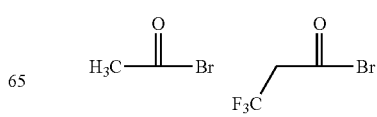

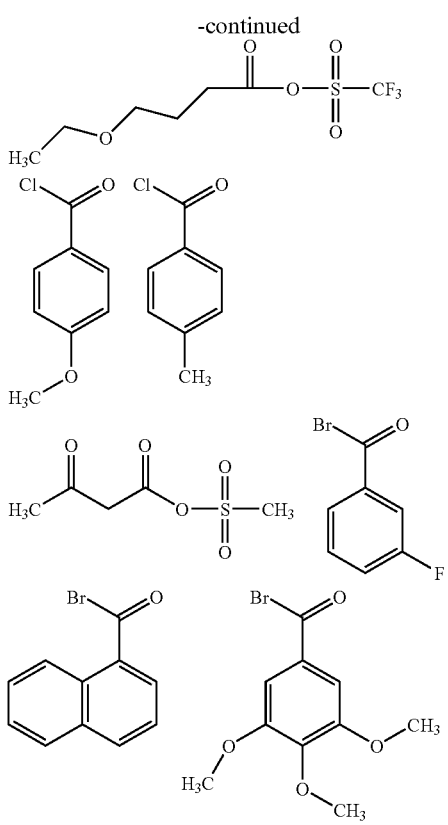

The reaction can be carried out in a suitable solvent by addition of G-M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of G-M employed is a slightly excess (3–6%) of the sum of the molar amounts of monomer of Structures X and XI less the molar amount of monomer of Structure XII. Addition of organic or inorganic base may also be employed. Examples of suitable organic amine bases include, but are not limited to, pyridine, triethylamine, 1,8-diazabicyclo[5.4.0]undec-7-ene (DBU), 1,5-diazabicyclo[4.3.0]non-5-ene (DBN), dimethyl pyridine, and dimethylaniline. Examples of other suitable bases include sodium hydroxide, sodium carbonate, and sodium silicate.

The preferred reaction solvents are propyleneglycol methyl ether acetate (PGMEA), N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

In some cases, the endcapping reaction with certain endcapping reagents, such as cyclic anhydrides, may not stop after the endcapping reaction. A subsequent dehydration step may also occur to form a divalent endcap (G* in Structures III* and IV*). Examples of cyclic anhydrides which may undergo this additional reaction include, but are not limited to, maleic anhydride, succinic anhydride, norbornane anhydride, norbornene anhydride, and camphor anhydride.

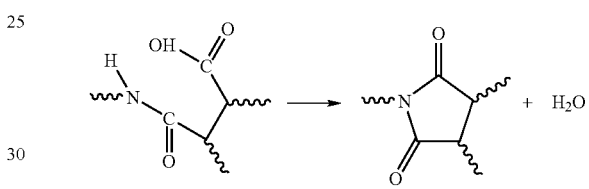

Polybenzoxazole precursor polymer of Structure IV may be synthesized by reaction of polybenzoxazole precursor polymer of Structure III with about 0.5% to about 25 mole % of a diazoquinone compound (based on the number of OH groups from the monomer of Structure X) in the presence of a base to yield the polybenzoxazole precursor IV according to Reaction 2.

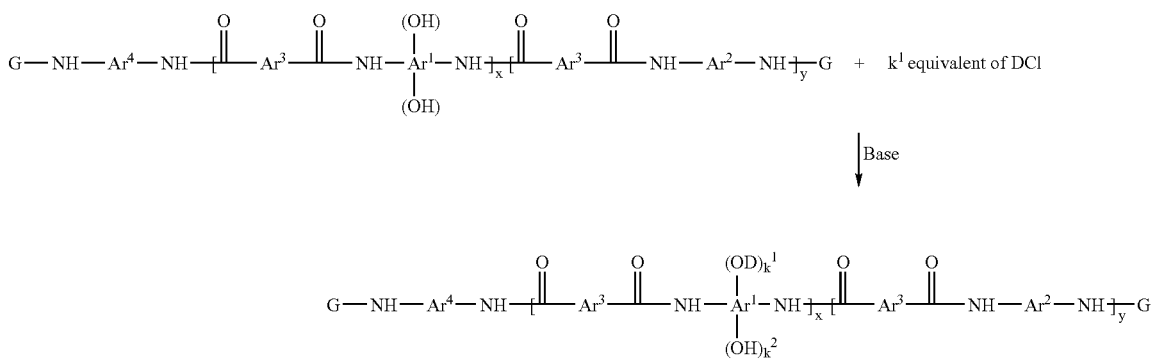

wherein $Ar^1$, $Ar^2$, $Ar^3$, $Ar^4$, D, $k^1$, $k^2$, x, y, and G are as previously defined. Similarly, the polymer having Structure IV* can be synthesized from the polymer having Structure III*.

Examples of the diazoquinone compound DCI that can be reacted with the PBO polymer III (III*) include, but are not limited to, one of the following:

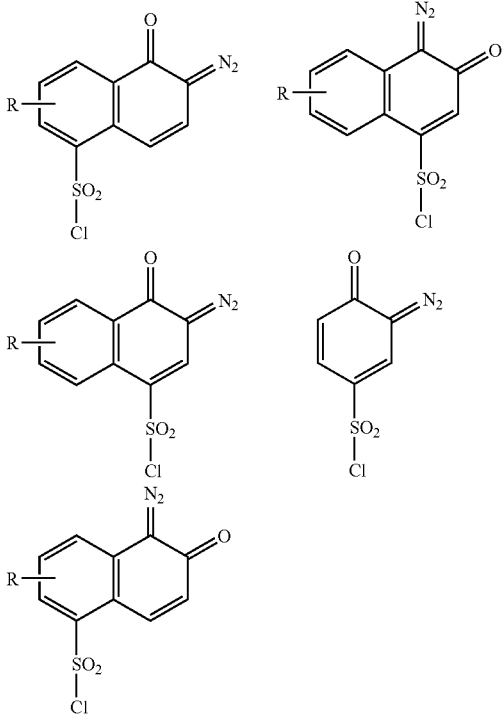

wherein, R is H, a halogen, a $C_1$–$C_4$ alkyl group, $C_1$–$C_4$ alkoxy group, cyclopentyl or cyclohexyl. Examples of suitable R groups include, but are not limited to, methyl, ethyl, propyl, isopropyl, n-butyl, sec-butyl, t-butyl, cyclopentyl or cyclohexyl.

The molar amount of DCI may range from about 0.5% to about 25% of the quantity of OH groups from monomers of Structure X to yield $k^1$ from 0.01 to about 0.4. A preferred amount of DCI is from about 0.5% to about 10% of the quantity of OH groups from monomers of Structure X to produce $k^1$ from about 0.01 to about 0.20. A more preferred amount of DCI is from about 0.5% to about 5% of the quantity of OH groups from monomers of Structure X to produce $k^1$ from about 0.01 to about 0.10. A most preferred amount of DCI is from about 0.5% to about 2.5% of the quantity of OH groups from monomers of Structure X to produce $k^1$ from about 0.01 to about 0.05.

The reaction conditions are identical to that description for the synthesis of polybenzoxazole precursor polymer of Structure II.

A polybenzoxazole precursor polymer of Structure IV (IV*) can also be prepared by reaction of a polybenzoxazole precursor polymer of Structure II with G-M. The definition of G and M are as defined before and the reaction condition is the same as described for the preparation of polybenzoxazole precursor polymer of Structure III (III*).

Polymers of Structure V can be synthesized by the reaction of hydroxysubstituted diamines with dianhydrides as described in U.S. Pat. No. 6,524,764 which is incorporated herein by reference. Polymers of Structure V may be synthesized by mixtures of hydroxysubstituted diamines or mixtures of dianhydrides, or both. Polymers having Structure V, when cured, can form a polymer having imide rings, oxazole rings or other cyclic Structures.

The positive acting photosensitive resin composition of this invention comprises at least one compound having structure VI:

wherein Y is selected from the group consisting of S, O, $NR^2$, $(HOCH)_m$, and

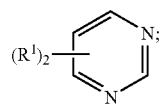

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$–$C_4$ alkyl group containing a thiol group; and wherein $V^1$ and $V^2$ are independently selected from the group consisting of

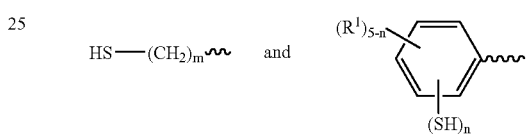

wherein, m is an integer from 0 to 4 with the proviso that m=0 only when Y=

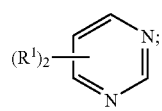

n is an integer from 1 to 5; and each $R^1$ is defined as above

Examples of compounds having structure VI include, but are not limited to:

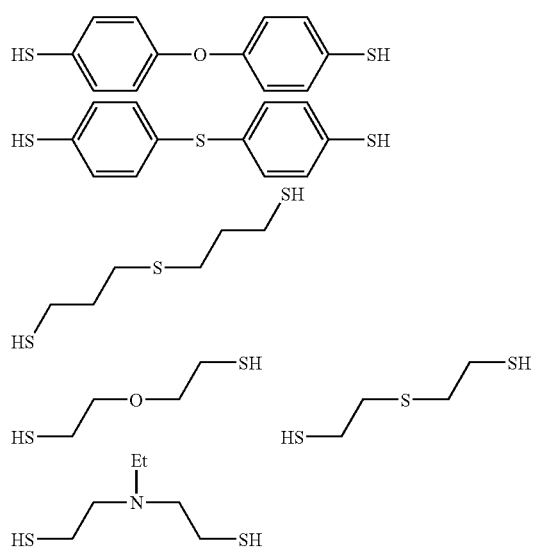

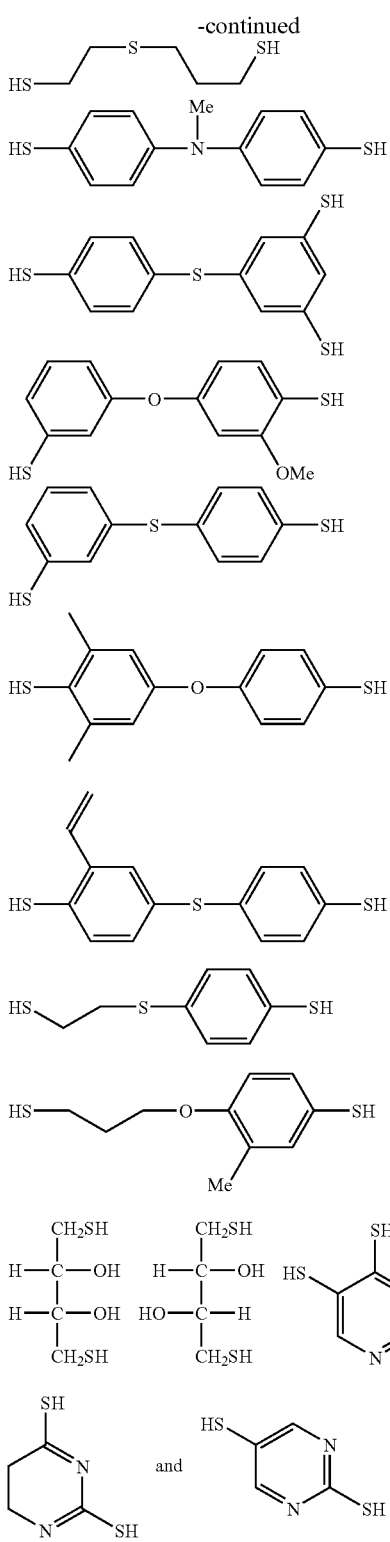

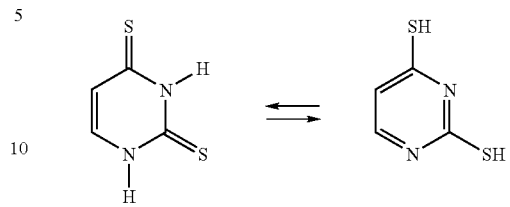

the description of this invention, both tautomeric forms are considered to be described by Structure VI.

A preferred range for m is from 1 to 3. Another preferred range for m is from 2 to 4. A more preferred range for m is from 2–3. Another more preferred range for m is from 3 to 4. A most preferred m is 2. A preferred range for n is from 1 to 3. A more preferred range for n is from 1 to 2. A most preferred n is 1.

Preferred compounds of Structure VI are those wherein Y is selected from the group consisting of S, (HOCH)$_m$, and

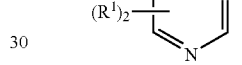

Examples of preferred compounds of Structure VI include, but are not limited to:

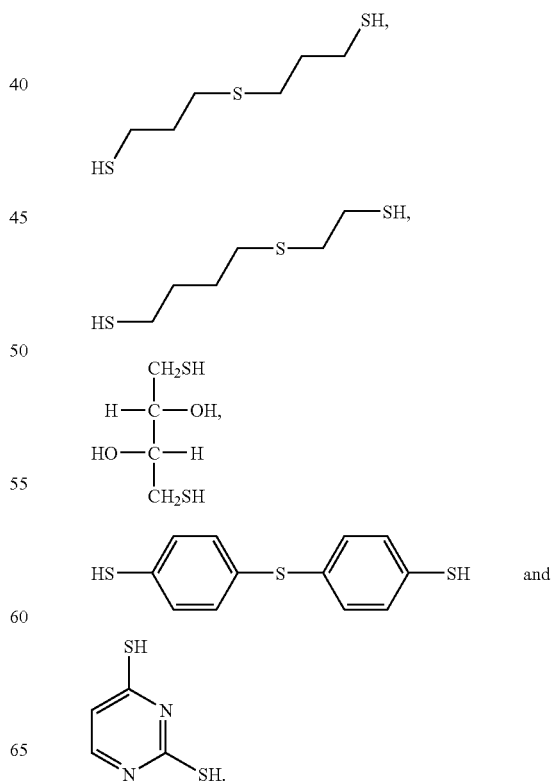

Examples of compounds of Structure VI can be purchased commercially or synthesized using synthetic procedures known to those skilled in the art.

Some of the compounds generally described by Structure VI can also exist (and may preferentially exist) in the tautomeric form VI' in certain situations. For the purposes of More preferred compounds of Structure VI are those wherein Y is selected from the group consisting of S, and

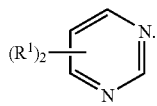

Examples of more preferred compounds of Structure VI include, but are not limited to,

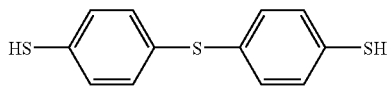

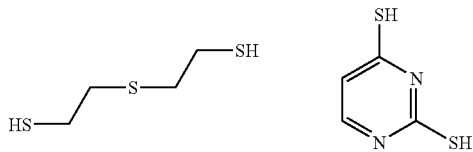

Suitable solvents of this photosensitive composition are polar organic solvents. Suitable examples of polar organic solvents include, but are not limited to, N-methyl-2-pyrrolidone (NMP), N-ethyl-2-pyrrolidone, gamma-butyrolactone (GBL), N,N-dimethylacetamide (DMAc), dimethyl-2-piperidone, N,N-dimethylformamide (DMF), and mixtures thereof. The preferred solvents are gamma-butyrolactone, N-ethyl-2-pyrrolidone and N-methyl-2-pyrrolidone. The most preferred solvent is gamma-butyrolactone.

The photoactive compound (d) of the photosensitive resin composition comprises one or more diazonaphthoquinone photoactive compounds which are the condensation products of compounds containing from about 2 to about 9 aromatic hydroxyl groups with one or more compounds of structure D (described above). Preferably structure D is a 5-naphthoquinone diazide sulfonyl compound and/or a 4-naphthoquinone diazide sulfonyl compound. Examples of photoactive compounds are illustrated in structures XIIIa—r.

The phenolic compounds (i.e. the backbone) typically employed in the preparation of a photoactive compound may be prepared by any suitable method. A common method of synthesis is by reaction of a suitable phenol derivative with a suitable aldehyde or ketone in the presence of a solvent such as methanol. The reaction is most often catalyzed by a strong acid (e.g. sulfuric acid or p-toluene sulfonic acid). Generally, the reaction is carried out at about 15° C. to about 80° C. for about 3 hours to about 48 hours.

The photoactive compounds XIII are synthesized by reaction of the backbone with DCI. Generally, the reaction is carried out at about 0° C. to about 30° C. for about 4 to about 36 hours in a solvent in the presence of a base. Generally, a slight excess of base to DCI is employed. Examples of bases include, but are not limited to, amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

Examples of compounds XIII include, but are not limited to, one or more of the following compounds where each Q is independently a hydrogen atom or D with the proviso that at least one Q=D wherein D is as defined before:

(XIII a)

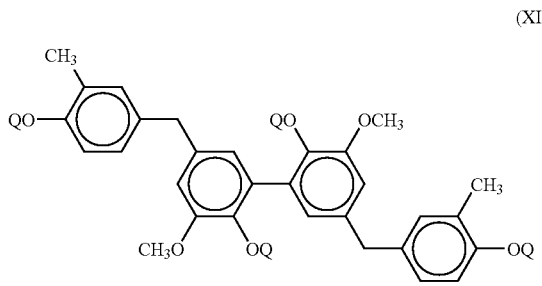

(XIIIb)

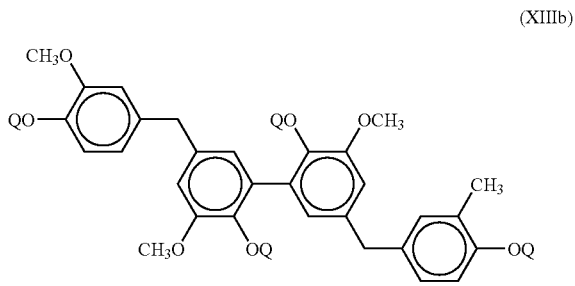

(XIII c)

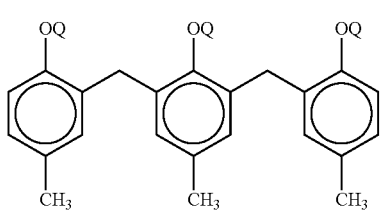

(XIII d)

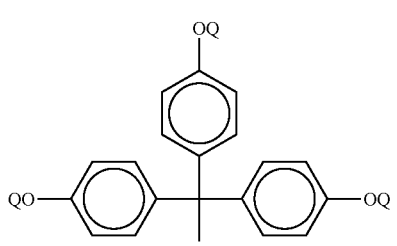

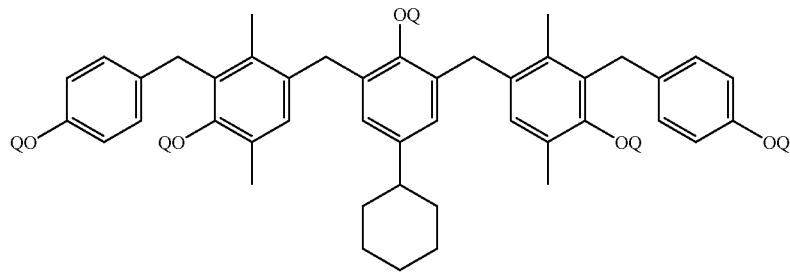
(XIII e)
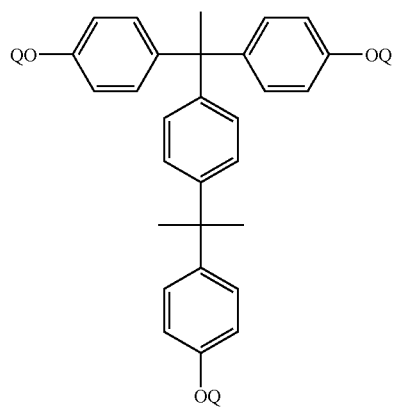
(XIII f)
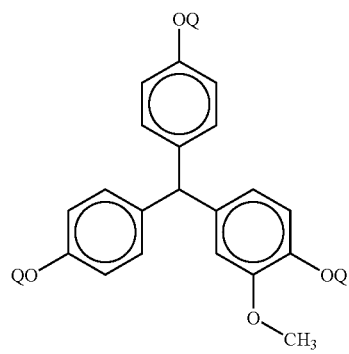
(XIII g)
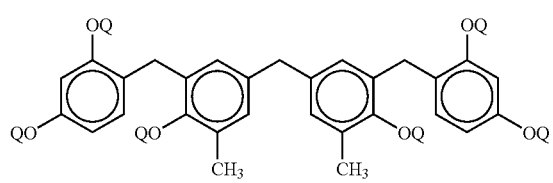
(XIII h)
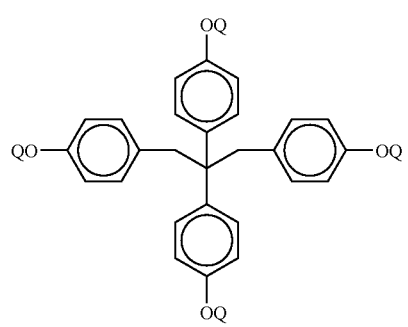
(XIII i)
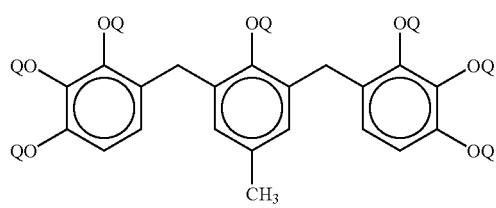
(XIII j)
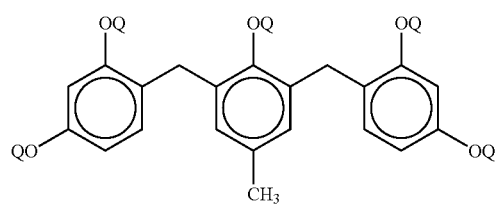
(XIII k)

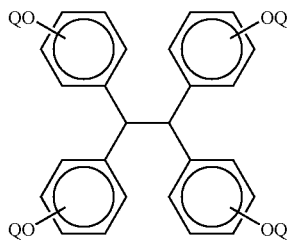 (XIII l)

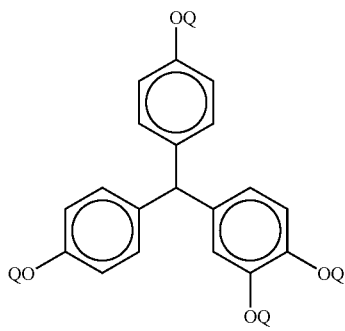 (XIII m)

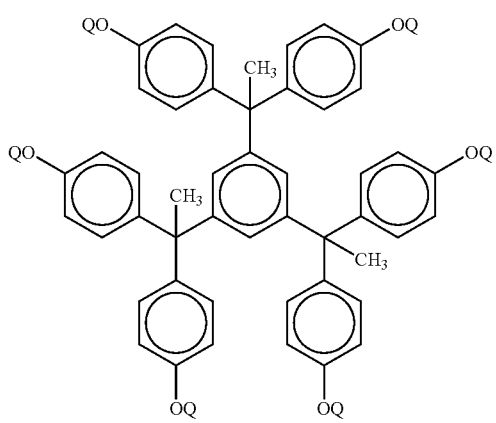 (XIII n)

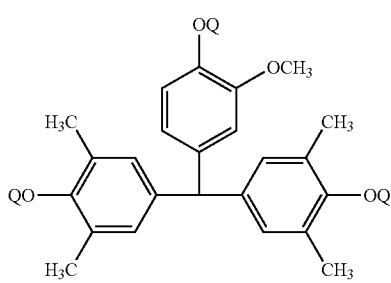 (XIII o)

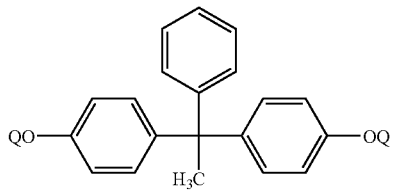 (XIII p)

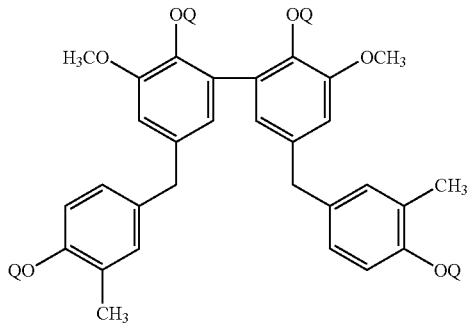 XIII r

The amount of polybenzoxazole precursor polymer(s) of Structures I, II, III, III*, IV, IV* or V in the photosensitive composition is from about 5 wt % to about 50 wt %. The more preferred amount of polybenzoxazole precursor polymer(s) of Structures I, II, III, III*, IV, IV* or V is from about 20 wt % to about 45 wt % and the most preferred amount of polybenzoxazole precursor polymer(s) of Structures I, II, III, III*, IV, IV* or V is from about 30 wt % to about 40 wt %. Polybenzoxazole precursor polymers of Structures I, II, III, III*, IV, IV* or V can be used singly or be combined in any ratio. Up to 25% of the amount of the polybenzoxazole precursor polymer of Structures I, II, III, III*, IV, IV* or V may be replaced by other organic solvent soluble, aqueous base soluble, aromatic or heterocyclic group polymers or copolymers. Examples of organic solvent soluble, aqueous base soluble, aromatic or heterocyclic group polymers or copolymers may include polyimides, polybenzoimidazoles, polybenzothiazoles, polytriazoles, polyquinazolones, polyquinazolindiones, polyquinacridones, polybenxazinones, polyanthrazolines, polyoxadiazoles, polyhydantoins, polyindophenazines, or polythiadiazoles.

The amount of component selected from Structure VI used in this composition is from about 0.02 wt % to about 3 wt % of the total weight of the composition, preferably about 0.05 wt % to 2 wt %, and most preferably about 0.06 wt % to about 1 wt %.

The solvent component (c) comprises about 40 wt % to about 80 wt % of the photosensitive composition. A preferred solvent range is from about 45 wt % to about 70 wt %. A more preferred range of solvent is from about 50 wt % to about 65 wt %.

The amount of diazoquinone compound (XIII), used in this composition is from about 0 wt % to about 25 wt % of the total weight of the composition, preferably from about 2 wt % to about 12 wt %, and most preferably from about 3 wt % to about 6 wt %. The amount of diazoquinone compound reduces as more of polymer(s) of Structures II or IV or IV* are used. Also the larger $k^1$ becomes, less diazoquinone compound is needed. With large $k^1$, there is no need to use the diazoquinone compound (XIII) because the amount of the diazoquinone moiety in the polymer is sufficient to produce a positive tone photoactive composition.

Optionally, an adhesion promoter may be included in the photosensitive composition. If employed, the amount of adhesion promoter ranges from about 0.1 wt % to about 2 wt % of total weight of composition. A preferred amount of adhesion promoter is from about 0.2 wt % to about 1.5 wt %. A more preferred amount of adhesion promoter is from about 0.3 wt % to about 1 wt %. Suitable adhesion promoters include, but are not limited to, amino silanes, and mixtures or derivatives thereof. Examples of suitable adhesion promoters which may be employed in the invention may be described by Structure XIV

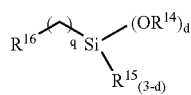

XIV wherein each $R^{14}$ is independently a $C_1$–$C_4$ alkyl group or a $C_5$–$C_7$ cycloalkyl group, each $R^{15}$ is independently a $C_1$–$C_4$ alkyl group, a $C_1$–$C_4$ alkoxy group, a $C_5$–$C_7$ cycloalkyl group or a $C_5$–$C_7$ cycloalkoxy group, d is an integer from 0 to 3 and q is an integer from 1 to about 6, $R^{16}$ is one of the following moieties:

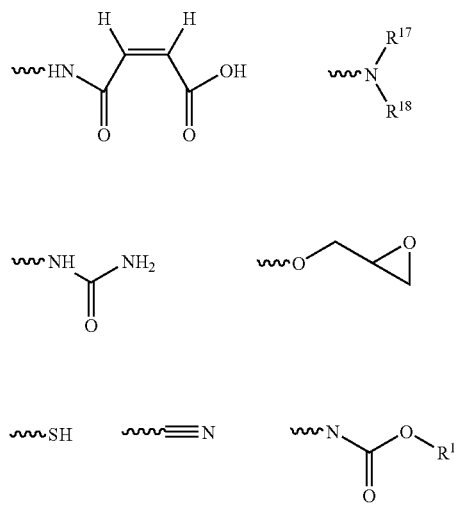

wherein each $R^{17}$ and $R^{18}$ are independently a $C_1$–$C_4$ alkyl group or a $C_5$–$C_7$ cycloalkyl group, and $R^{19}$ is a $C_1$–$C_4$ alkyl group or a $C_5$–$C_7$ cycloalkyl group. Preferred adhesion promoters are those wherein $R^{16}$ is selected from

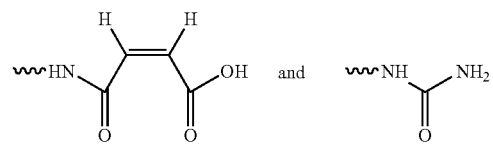

More preferred adhesion promoters are those wherein $R^{16}$ is

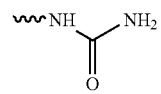

The most preferred adhesion promoters are

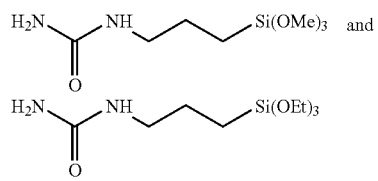

The photosensitive compositions of the present invention may further include other additives. Suitable additives include, for example, leveling agents, dissolution inhibitors and the like. Such additives may be included in the photosensitive compositions in about 0.03 to about 10 wt % of the total weight of composition.

Another embodiment of the present invention concerns a process for forming a relief pattern using the positive photosensitive composition. The process comprises the steps of:

(a) coating on a suitable substrate, a positive-working photosensitive composition comprising one or more polybenzoxazole precursor polymers having Structures I or II or III or III* or IV or IV* or V or mixtures thereof, at least one compound having Structure VI and at least one solvent, with the proviso that if the polybenzoxazole precursor polymer solely consists of I or III or III* or V or a mixture of any of the four, then at least one photoactive compound is also present, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

The process may optionally include the step of precoating a substrate with a solvent containing an adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed.

Classes of suitable external adhesion promoters include, but are not limited to, vinylalkoxysilanes, methacryloxyalkoxysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to, gamma-aminopropyltrimethoxy-silane, gamma-glycidoxypropylmethyldimethoxysilane, gamma-glycidoxypropyl-methyldiethoxysilane, gamma-mercaptopropylmethyldimethoxysilane, 3-methacryloxypropyldimethoxymethylsilane, and 3-methacryloxypropyltrimethoxysilane. gamma-aminopropyltrimethoxy-silane is more preferred. Additional suitable adhesion promoters are described in "Silane Coupling Agent" Edwin P. Plueddemann, 1982 Plenum Press, New York.

The positive acting, photoactive composition of this invention is coated on a suitable substrate. The substrate may be, for example, semiconductor materials such as a silicon wafer, compound semiconductor (III-V) or (II-VI) wafer, a ceramic, glass or quartz substrate. Said substrates may also contain films or structures used for electronic circuit fabrication such as organic or inorganic dielectrics, copper or other wiring metals. The preferred substrate for this invention is a wafer containing exposed copper.

Coating methods include, but are not limited to, spray coating, spin coating, offset printing, roller coating, screen printing, extrusion coating, meniscus coating, curtain coating, and immersion coating.

The resulting film is prebaked at an elevated temperature. The bake may be completed at one or more temperatures within the temperature bake of from about 70° C. to about 130° C. for several minutes to half an hour, depending on the method, to evaporate the remaining solvent. Any suitable baking means may be employed. Examples of suitable baking means include, but are not limited to, hot plates and convection ovens. The resulting dry film has a thickness of from about 3 to about 50 micron or more preferably from about 4 to about 20 micron or most preferably from about 5 to about 15 micron.

After the bake step, the resulting dry film is exposed to actinic rays in a preferred pattern through a mask. X-rays, electron beam, ultraviolet rays, visible light, and the like can be used as actinic rays. The most preferred rays are those with wavelength of 436 nm (g-line) and 365 nm (i-line).

Following exposure to actinic radiation, in an optional step it may be advantageous to heat the exposed and coated substrate to a temperature between about 70° C. and about 130° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post-exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof.

The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. After development, the relief pattern may be optionally rinsed using deionized water and dried by spinning, baking on a hot plate, in an oven, or other suitable means.

Following development, in an optional step it may be advantageous to heat the exposed, coated and developed substrate to a temperature between about 70° C. and about 130° C. The exposed, coated and developed substrate is heated in this temperature range for a short period of time, typically several seconds to several minutes and may be carried out using any suitable heating means. Preferred means include baking on a hot plate or in a convection oven. This process step is commonly referred to in the art as post-develop baking.

The benzoxazole ring is then formed by curing of the uncured relief pattern to obtain the final high heat resistant pattern. Curing is performed by baking the developed, uncured relief pattern at or above the glass transition temperature $T_g$ of the photosensitive composition to obtain the benzoxazole ring that provides high heat resistance. Typically, temperatures above about 200° C. are used.

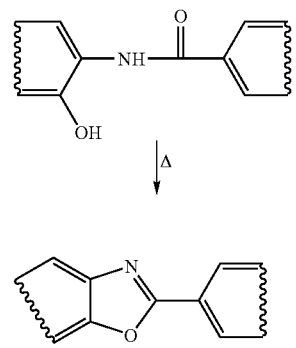

Formation of polybenzoxazole ring

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate, a convection oven, tube furnace, vertical tube furnace, or rapid thermal processor. Alternatively, curing may be effected by the action of microwave or infrared radiation.

The invention is illustrated by, but not limited to, the following examples in which the parts and percentages are by weight (wt %) unless otherwise specified.

SYNTHESIS EXAMPLE 1

Synthesis of Polybenzoxazole Precursor Polymer of Structure (Ia)

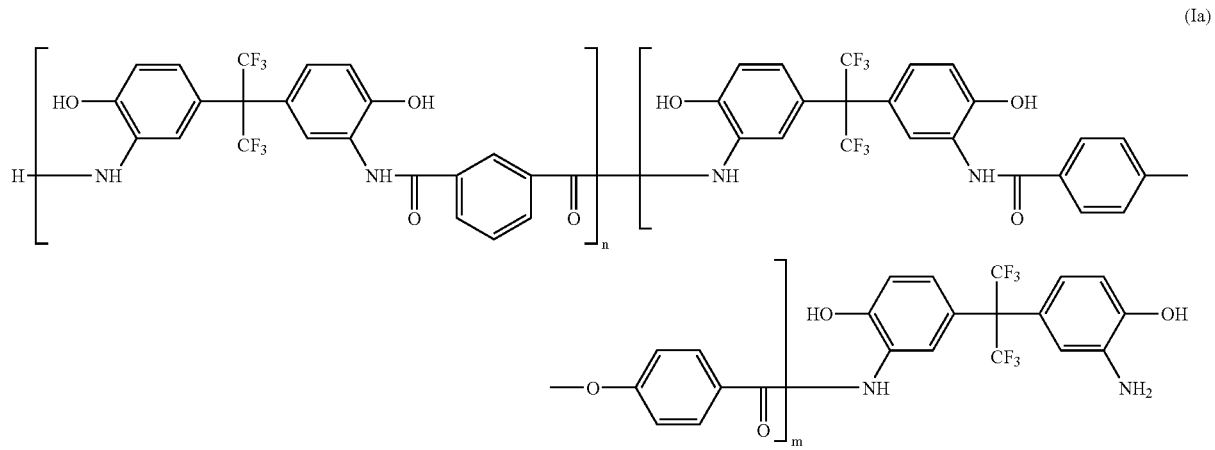

(Ia)

To a 2 liter, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, then cooled in an ice water bath at 0–5° C. To this solution, 39.3 g (194 mmol) of isophthaloyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred deionized water. The polymer was collected by filtration and washed with deionized water and a water/methanol (50/50) mixture. The polymer was dried under vacuum conditions at 105° C. for 24 hours.

The yield was almost quantitative and the inherent viscosity (iv) of the polymer was 0.20 dl/g measured in NMP at a concentration of 0.5 g/dl at 25° C.

SYNTHESIS EXAMPLE 2

Synthesis of Polybenzoxazole Precursor Polymer of Structure (IIa)

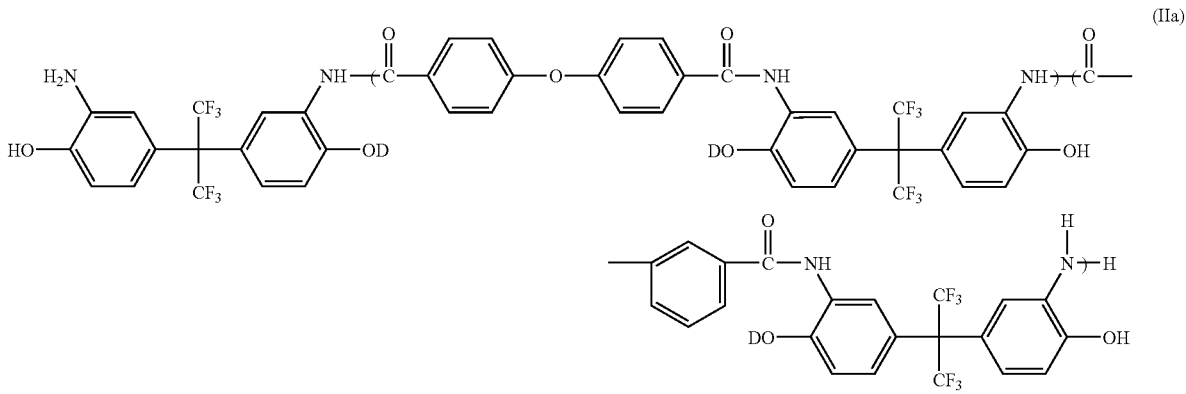

(IIa)

To a 1 liter three-necked round bottom flask equipped with a mechanical stirrer, 54.2 g (100 mmol) of the polymer obtained in Synthesis Example 1 and 500 ml of tetrahydrofuran (THF) were added. The mixture was stirred for ten minutes and the solid was fully dissolved. 0.81 g (3 mmole) of 5-naphthoquinone diazide sulfonyl chloride was then added and the mixture was stirred for another 10 minutes. Triethylamine, 0.3 g (3 mmol), was added gradually within 15 minutes and then the reaction mixture was stirred for 5 hours. The reaction mixture was then added gradually to 5000 ml of vigorously stirred deionized water. The precipitated product was separated by filtration and washed with 2 liters of deionized water. To the product was added another 6 liters deionized water and the mixture vigorously stirred for 30 minutes. After filtration the product was washed with 1 liter deionized water. The isolated product was dried at 40°

C. overnight. The inherent viscosity of the polymer was 0.21 dl/g measured in NMP at the concentration of 0.5 g/dl at 25° C.

SYNTHESIS EXAMPLE 3

Synthesis of a Photoactive Compound PAC A

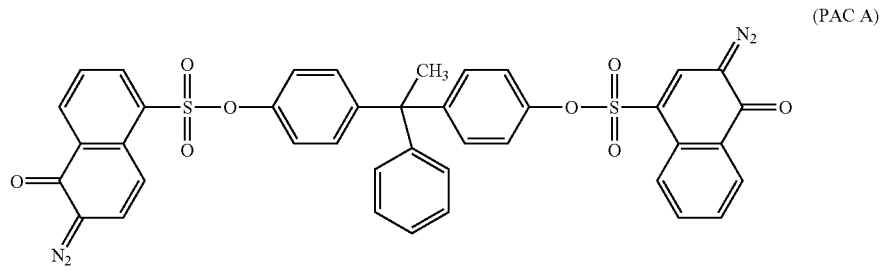

(PAC A)

To a 500 ml, 3-neck flask equipped with mechanical stirrer, dropping funnel, pH probe, thermometer and nitrogen purge system were added 225 ml of THF and 30 g of (4,4'-(1-phenylethylidene)bisphenol) (Bisphenol AP). The mixture was stirred until Bisphenol AP was fully dissolved. To this was added 27.75 g of 4-naphthoquinone diazide sulfonyl chloride (S214-Cl) and 25 ml of THF. The reaction mixture was stirred until the solid was fully dissolved. 10.48 g of triethylamine dissolved in 50 ml THF was added to the reaction mixture gradually while the pH was kept below 8 during this process. The temperature during this exothermic reaction was kept below 30° C. Upon completion of addition, the reaction mixture was stirred for 48 hours. To this was added 27.75 g of 5-naphthoquinone diazide sulfonyl chloride (S215-Cl) and 25 ml of THF and the reaction mixture was stirred for 30 minutes. 10.48 g triethylamine dissolved in 50 ml THF was added to the reaction mixture gradually while the pH was kept below 8 during this process.

Again during this exothermic reaction the temperature was kept below 30° C. Upon completion of the addition, the reaction mixture was stirred for 20 hours. The reaction mixture was then added gradually to a mixture of 6 liters of deionized water and 10 g of HCl. The product was filtered and washed with 2 liters of deionized water. The product was then reslurried by using 3 liters of deionized water, filtered and washed with 1 liter of deionized water. The product was then dried inside a vacuum oven at 40° C. until the amount of water dropped below 2%. HPLC analysis revealed that the product was a mixture of several esters as shown in Table 1.

TABLE 1

| Structure | DNQ moiety | Example 3 |
|---|---|---|
| (naphthoquinone diazide with SO₂Cl at 4-position) | S214 | 0.61% |
| (naphthoquinone diazide with SO₂Cl at 5-position) | S215 | 0.53% |
| (Bisphenol AP monoester with S214 DNQ group) | S214 monoester | 1.72% |

TABLE 1-continued

| Structure | DNQ moiety | Example 3 |
|---|---|---|
| (naphthoquinone diazide sulfonate monoester of bisphenol-like structure with CH₃ and phenyl) | S215 monoester | 1.4% |
| (diester with two naphthoquinone diazide sulfonate groups) | S215 diester | 18.9% |
| (mixed ester PAC structure) | Mixed Ester PAC | 46.7% |
| (S214 diester structure) | S214 diester | 29% |

SYNTHESIS EXAMPLE 4

Synthesis of Polybenzoxazole Precursor Polymer of Structure (Ic)

Synthesis of polymer Ic was similar to polymer Ia in Synthesis Example 1 except the ratio of 1,4-oxydibenzoyl chloride to isophthaloyl chloride changed from 1/1 to 4/1.

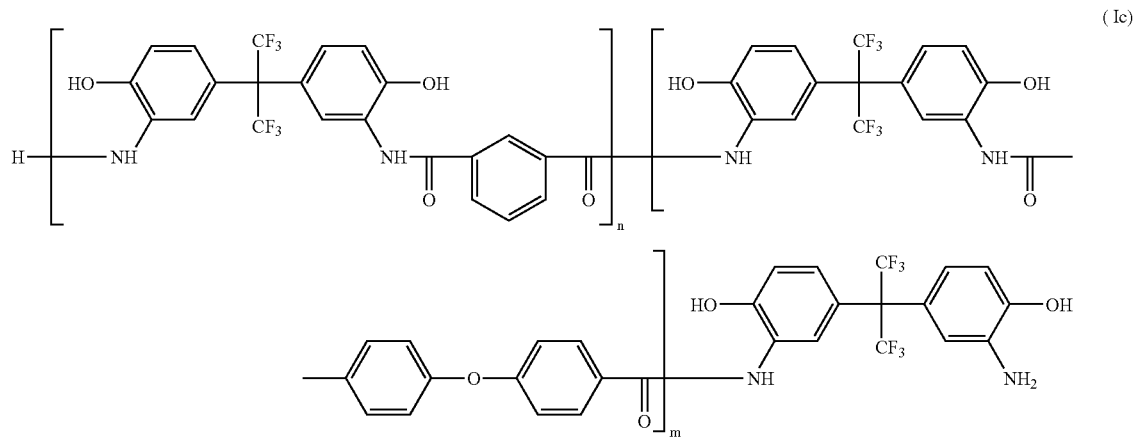

SYNTHESIS EXAMPLE 5

Synthesis of Polybenzoxazole Precursor Polymer of Structure (IIc)

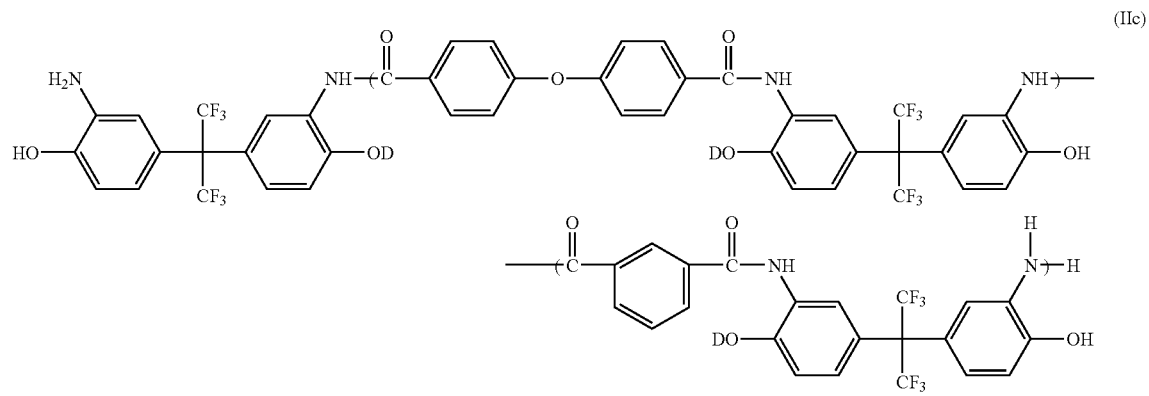

Synthesis of polymer IIc was similar to polymer IIa in Synthesis Example 2, except polymer Ic was used instead of polymer Ia and the ratio of 5-naphthoquinone diazide sulfonyl chloride to OH group was changed from 1.5% to 1%.

SYNTHESIS EXAMPLE 6

Synthesis of Polybenzoxazole Precursor Polymer of Structure (IV*c)

A PBO polymer prepared in the same way as in Synthesis Example 5 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10–12 torr). About 550 g of solvents was removed during the azeotropic distillation. The reaction solution was placed under a $N_2$ blanket and equipped with a magnetic stirrer. Nadic anhydride (7 g) was added followed by 10 g of pyridine. The reaction was stirred overnight at 50° C. Then the reaction mixture was diluted with 500 g of tetrahydrofuran (THF) and precipitated into 8 liters of a 50:50 methanol:water mixture. The polymer was collected by filtration and vacuum dried at 40° C. The yield was almost quantitative.

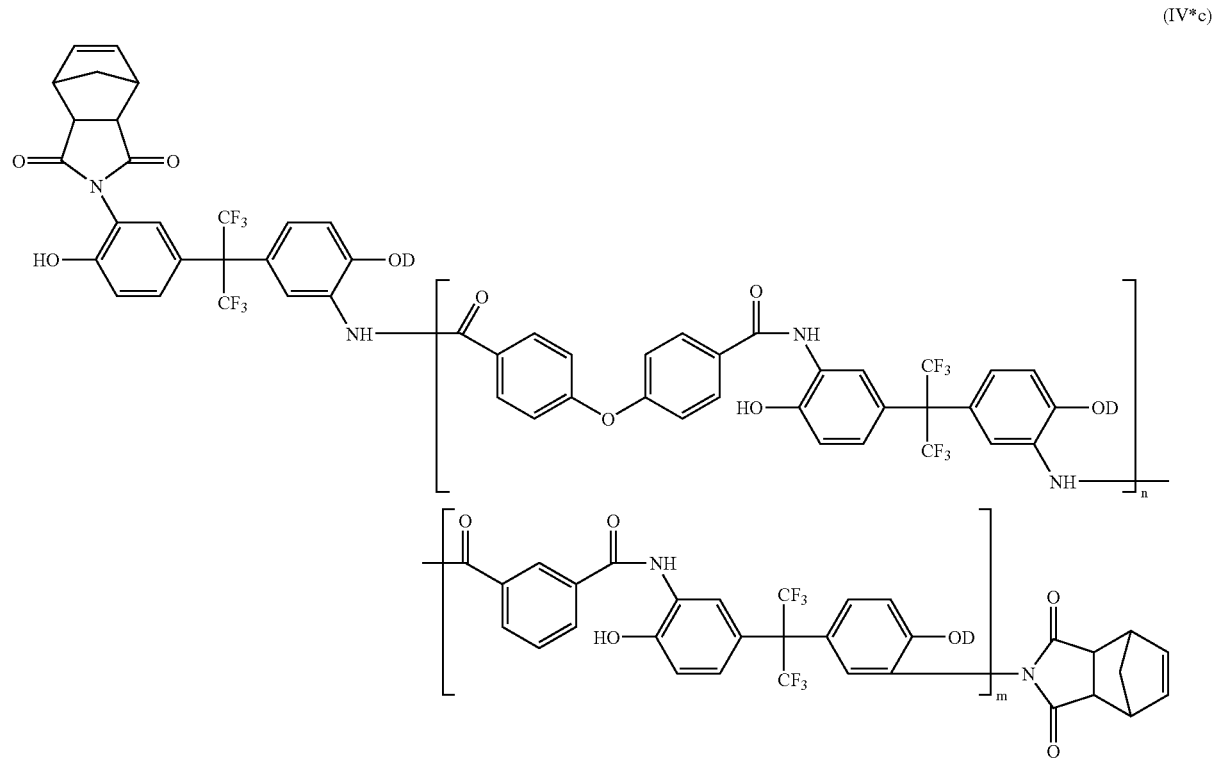

EXAMPLE 1

100 parts of the polymer obtained in Synthesis Example 2, 1.53 parts of gamma-ureidopropyltrimethoxysilane, 2.48 parts of diphenylsilanediol, 13.51 parts of PAC synthesized in Synthesis Example 3 and 2 parts of 2-mercaptoethyl sulfide were dissolved in 175 parts GBL and filtered.

A copper-coated wafer was then coated with the formulation and hotplate baked for 4 minutes at 120° C., resulting in a film thickness of 11.16 µm. The film was then exposed utilizing an i-line stepper with a patterned exposure array, which incrementally increased the exposure energy by 30 mJ/cm$^2$ after each exposure with a starting exposure energy of 300 mJ/cm$^2$. The film was then developed using two 30 second puddles with a 2.38% aqueous TMAH solution, rinsed with deionized water and dried to provide a relief pattern.

The patterned copper-coated wafer was then scratched with a pair of tweezers so as to peel off any material down to the copper substrate. The scratch was then analyzed under a microscope concentrating on areas were the scratch dissected the exposed patterns. This scratching technique allowed differentiation between the substrate (bare copper) and any residue remaining in the exposed area. No residue was observed. The formulation without 2-mercaptoethyl sulfide showed a heavy residue of material remaining in the exposed areas (see Comparative Example 1).

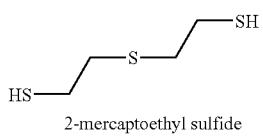

2-mercaptoethyl sulfide

EXAMPLE 2 AND COMPARATIVE EXAMPLES 1–3

Example 2 and Comparative Examples 1–3 used the same formulation as described in Example 1 except the amount of 2-mercaptoethyl sulfide varied in each formulation. A process similar to that described in Example 1 was employed for each composition. The results are shown in Table 2.

TABLE 2

| Example # | Amount of 2-mercaptoethyl sulfide (wt %) | Residue after pattern |
|---|---|---|
| 2 | 0.34 | No |
| Comp. Ex. 1 | 0 | Yes |
| Comp. Ex. 2 | 0.17 | Yes |
| Comp. Ex. 3 | 1.27 | Yes |

EXAMPLE 3

A copper-coated wafer was coated with the formulation from Example 1 and hotplate baked for 4 minutes at 120° C., resulting in a film thickness of 10.87 µm. The film was then exposed utilizing an i-line stepper with a patterned exposure array, which incrementally increased the exposure energy by 10 mJ/cm$^2$ after each exposure with a starting exposure energy of 100 mJ/cm$^2$. The film was then developed using two 30 second puddles with a 2.38% aqueous TMAH solution, rinsed with deionized water and dried to provide a relief pattern. The exposure energy required to clear all the material from an exposed area ($E_O$) was 235 mJ/cm$^2$. The unexposed film thickness after development was 5.95 µm.

EXAMPLE 4

A copper-coated wafer was coated with the formulation from Example 2 and hotplate baked for 4 minutes at 120° C., resulting in a film thickness of 10.98 µm. The film was then exposed utilizing an i-line stepper with a patterned exposure array, which incrementally increased the exposure energy by 10 mJ/cm$^2$ after each exposure with a starting exposure energy of 100 mJ/cm$^2$. The film was then developed using two 30 second puddles with a 2.38% aqueous TMAH solution, rinsed with deionized water and dried to provide a relief pattern. The exposure energy required to clear all the material from an exposed area ($E_O$) was 220 mJ/cm$^2$. The unexposed film thickness after development was 5.60 µm.

Examples 3 and 4 demonstrated that the copper compatible compositions of Examples 1 and 2 can be used on other substrates such as silicon. Each resist had good photospeed and excellent resolution of 2–3 µm.

COMPARATIVE EXAMPLE 4

100 parts of the polymer obtained in Synthesis Example 4, 3 parts of gamma-glycidoxypropyltrimethoxy silane, 2 parts of nonanedithiol, 7.5 parts of PAC shown in structure XIIIO (see below), 15 parts of PAC synthesized in Example 3 were dissolved in 175 parts GBL and filtered.

A copper-coated wafer was then coated with the formulation and hotplate baked for 4 minutes at 120° C., resulting in a film thickness of 10.92 µm. The film was then exposed utilizing an i-line stepper with a patterned exposure array, which incrementally increased the exposure energy by 30 mJ/cm$^2$ after each exposure with a starting exposure energy of 300 mJ/cm$^2$. The film was then developed using two 30 second puddles with a 2.38% aqueous TMAH solution, rinsed with deionized water and dried to provide a relief pattern.

The patterned copper-coated wafer was then scratched with a pair of tweezers so as to peel off any material down to the copper substrate. The scratch was then analyzed under a microscope concentrating on areas were the scratch dissected the exposed patterns. This scratching technique allowed differentiation between the substrate (bare copper) and any residue remaining in the exposed area. Some residue was observed in the exposed area.

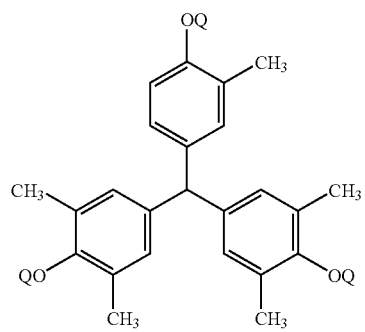

-continued wherein Q = H or

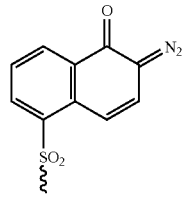

Structure of PAC XIIIO (82% of OH groups are esterified)

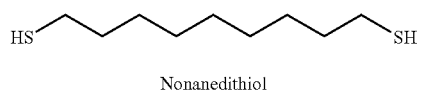

Nonanedithiol

EXAMPLE 5

100 parts of the polymer obtained in Synthesis Example 6, 3 parts of gamma-mercaptopropyltrimethoxy silane, 1 part of dithiothreitol and 12 parts of PAC XIIIq (see below) were dissolved in 175 parts GBL and filtered.

A copper-coated wafer was then coated with the formulation and hotplate baked for 4 minutes at 120° C., resulting in a film thickness of 11.1 μm. The film was then exposed utilizing an i-line stepper with a patterned exposure array, which incrementally increased the exposure energy by 30 mJ/cm$^2$ after each exposure with a starting exposure energy of 300 mJ/cm$^2$. The film was then developed using two 30 second puddles with a 2.38% aqueous TMAH solution, rinsed with deionized water and dried to provide a relief pattern.

The patterned copper-coated wafer was then scratched with a pair of tweezers so as to peel off any material down to the copper substrate. The scratch was then analyzed under a microscope concentrating on areas were the scratch dissected the exposed patterns. This scratching technique allowed differentiation between the substrate (bare copper) and any residue remaining in the exposed area. No residue was observed.

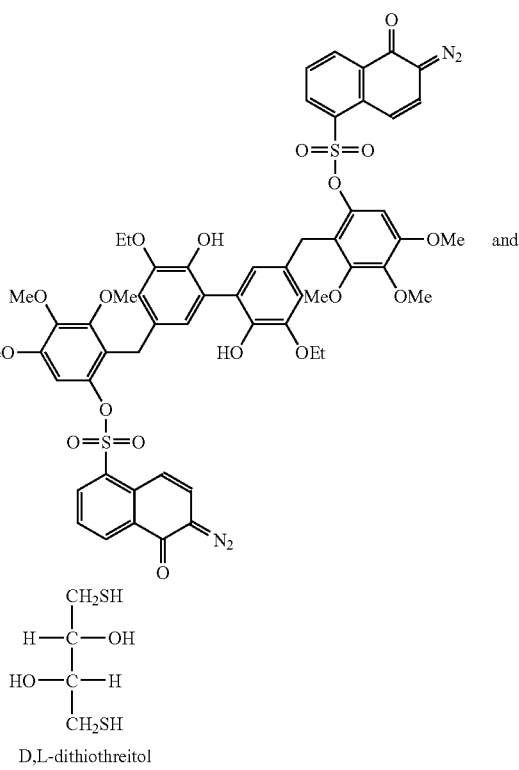

D,L-dithiothreitol

SYNTHESIS EXAMPLE 7

Preparation of Polybenzoxazole Precursor Polymer of Structure (IIIa)

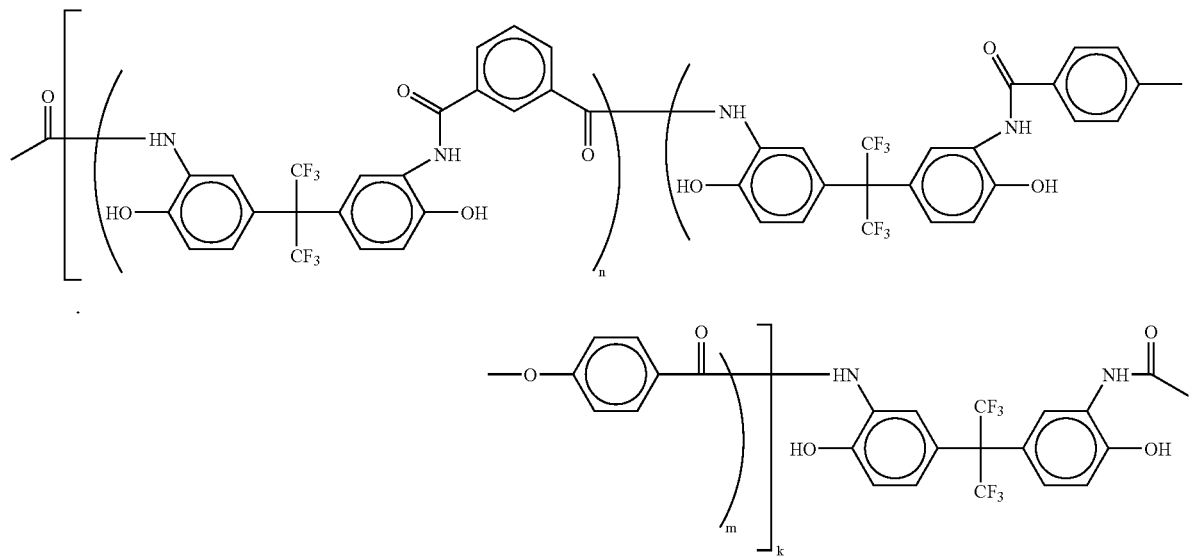

100 g of the PBO precursor polymer obtained following the procedure from Synthesis Example 1 was dissolved in 1000 g of diglyme. Residual water was removed as an azeotrope with diglyme using a rotary evaporator at 65° C. (10–12 torr). About 500 g of solvents were removed during the azeotropic distillation. The reaction solution was placed under a $N_2$ blanket, equipped with a magnetic stirrer and cooled using an ice bath down to ~5° C. 3.6 g acetyl chloride was added via syringe. The reaction was held on the ice bath for about 10 minutes. Then the ice bath was removed and the reaction was allowed to warm up over the period of 1 hour. Then, the mixture was again cooled to 5° C. on the ice bath. 3.6 g pyridine was added via syringe over the period of 1 hour. The reaction was kept on the ice bath for ~10 minutes following the pyridine addition, and then was allowed to warm up over the period of 1 hour.

The reaction mixture was precipitated into 6 liters of water with stirring. The precipitated polymer was collected by filtration and air dried overnight. Then, the polymer was dissolved in 500–600 g of acetone and precipitated into 6 liters of water/methanol (70/30). The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hour. The final product was precipitated in 7 liters of water, filtered, air-dried overnight followed by 24 hours drying in a vacuum oven at 90° C.

The yield was 100% and the inherent viscosity (iv) of the polymer was 0.205 dl/g measured in NMP at a concentration of 0.5 g/dl at 25° C.

EXAMPLE 6

A positive acting photosensitive composition is prepared from 100 parts of a polymer prepared by the method described in Synthesis Example 4, 3 parts of gamma-glycidoxypropyltrimethoxy silane, 4 part of D,L-dithiothreitol, 9 parts of PAC shown in structure XIIIO (see above), 13 parts of PAC synthesized in Example 3, 125 parts propylene glycol methyl ether acetate (PGMEA) and 50 parts GBL and filtered.

A copper-coated wafer is then coated with the formulation and hotplate baked for 5 minutes at 120° C., resulting in a film thickness of 11 μm. The film is then exposed utilizing an i-line stepper with a patterned exposure array, which incrementally increases the exposure energy by 50 mJ/cm$^2$ after each exposure with a starting exposure energy of 50 mJ/cm$^2$. The film is then developed for 95 seconds under a continuous spray of a 2.38% aqueous TMAH solution, rinsed with deionized water and dried to provide a relief pattern.

The patterned copper-coated wafer is then scratched with a pair of tweezers so as to peel off any material down to the copper substrate. The scratch is then analyzed under a microscope concentrating on areas where the scratch dissects the exposed patterns. This scratching technique allows differentiation between the substrate (bare copper) and any residue remaining in the exposed area. No residue is observed.

EXAMPLE 7

A positive acting photosensitive composition is prepared from 100 parts of a polymer prepared by the method described in Synthesis Example 2, 3 part of D,L-dithiothreitol, 14 parts of PAC synthesized as in Example 3, 125 parts GBL and 50 parts N-methyl-2-pyrrolidone (NMP) and filtered.

A copper-coated wafer is primed with an aminosilane type adhesion promoter (QZ3289 commercially available for FUJIFILM Electronic Materials U.S.A., Inc.) then coated with the formulation and hotplate baked for 10 minutes at 90° C., resulting in a film thickness of 13 μm. The film is then exposed utilizing an i-line stepper with a patterned exposure array, which incrementally increases the exposure energy by 50 mJ/cm$^2$ after each exposure with a starting exposure energy of 50 mJ/cm$^2$. The film is then developed for using two 50 second puddles with a 2.38% aqueous TMAH solution, rinsed with deionized water and dried to provide a relief pattern.

The patterned copper-coated wafer is then scratched with a pair of tweezers so as to peel off any material down to the copper substrate. The scratch is then analyzed under a microscope concentrating on areas where the scratch dissects the exposed patterns. This scratching technique allows differentiation between the substrate (bare copper) and any residue remaining in the exposed area. No residue is observed.

EXAMPLE 8

A positive acting photosensitive composition is prepared from 100 parts of a polymer prepared by the method described in Synthesis Example 7, 2.5 parts of gamma-mercaptopropyltrimethoxy silane, 2 part of 2-mercaptoethyl sulfide, 24 parts of PAC shown in structure XIIIq (see above) and 5 parts of diphenylsilanediol, 135 parts PGMEA and 40 parts ethyl lactate and filtered.

A copper-coated wafer is then coated with the formulation and hotplate baked for 6 minutes at 110° C., resulting in a film thickness of 10 μm. The film is then exposed utilizing an i-line stepper with a patterned exposure array, which incrementally increases the exposure energy by 50 mJ/cm$^2$ after each exposure with a starting exposure energy of 50 mJ/cm$^2$. The film is then developed using two 30 second puddles with a 2.38% aqueous TMAH solution, rinsed with deionized water and dried to provide a relief pattern.

The patterned copper-coated wafer is then scratched with a pair of tweezers so as to peel off any material down to the copper substrate. The scratch is then analyzed under a microscope concentrating on areas where the scratch dissects the exposed patterns. This scratching technique allows differentiation between the substrate (bare copper) and any residue remaining in the exposed area. No residue is observed.

EXAMPLE 9

A positive acting photosensitive composition is prepared from 100 parts of a polymer prepared by the method described in Synthesis Example 7, 3 part of dithiouracil, 3.5 parts of gamma-ureidopropyltrimethoxysilane, 24 parts of PAC shown in structure XIIIO (see above), 100 parts PGMEA, 50 parts GBL and 25 parts ethyl lactate and filtered.

A copper-coated wafer is then coated with the formulation and hotplate baked for 4 minutes at 125° C., resulting in a film thickness of 9 μm. The film is then exposed utilizing an i-line stepper with a patterned exposure array, which incrementally increases the exposure energy by 50 mJ/cm$^2$ after each exposure with a starting exposure energy of 50 mJ/cm$^2$. The film is then developed for 110 seconds under a continuous spray of a 2.38% aqueous TMAH solution, rinsed with deionized water and dried to provide a relief pattern.

The patterned copper coated wafer is then scratched with a pair of tweezers so as to peel off any material down to the copper substrate. The scratch is then analyzed under a microscope concentrating on the areas where the scratch dissects the exposed patterns. This scratching technique allows differentiation between the substrate (bare copper) and any residue remaining in the exposed area. No residue is observed.

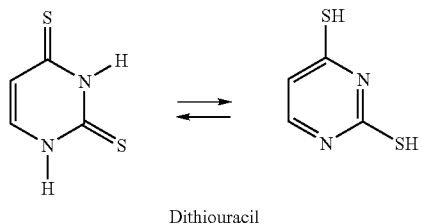

Dithiouracil

EXAMPLE 10

A positive acting photosensitive composition is prepared from 100 parts of a polymer prepared by the method described in Synthesis Example 7, 3 part is of 4,4'-thiobenzenethiol, 3.5 parts of gamma-ureidopropyltrimethoxysilane, 22 parts of PAC shown in structure XIIIf (see below), 100 parts PGMEA, 50 parts GBL and 25 parts ethyl lactate and filtered.

A copper-coated wafer is then coated with the formulation and hotplate baked for 4 minutes at 125° C., resulting in a film thickness of 9 μm. The film is then exposed utilizing an i-line stepper with a patterned exposure array, which incrementally increases the exposure energy by 50 mJ/cm² after each exposure with a starting exposure energy of 50 mJ/cm². The film is then developed for 110 seconds under a continuous spray of a 2.38% aqueous TMAH solution, rinsed with deionized water and dried to provide a relief pattern.

The patterned copper-coated wafer is then scratched with a pair of tweezers so as to peel off any material down to the copper substrate. The scratch is then analyzed under a microscope concentrating on areas where the scratch dissects the exposed patterns. This scratching technique allows differentiation between the substrate (bare copper) and any residue remaining in the exposed area. No residue is observed.

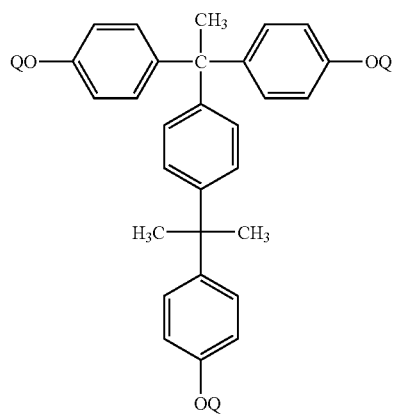

-continued

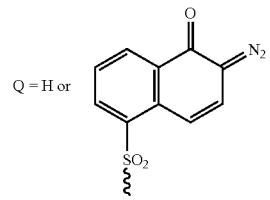

Q = H or

Structure of PAC XIIIf (75% of OH groups are esterified)

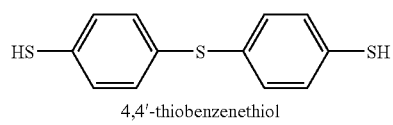

4,4'-thiobenzenethiol

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A photosensitive resin composition comprising:
   (a) at least one polybenzoxazole precursor polymer;
   (b) at least one compound having structure VI $$V^1-Y-V^2 \qquad \qquad VI$$

wherein Y is selected from the group consisting of S, O, $NR^2$, $(HOCH)_p$, and

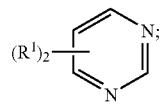

wherein each $R^1$ is independently selected from the group consisting of H, an alkyl group, an alkenyl group, an alkynyl group, an alkoxy group, and a halogen, each $R^2$ is independently selected from the group consisting of H, SH, $CH_3$, $C_2H_5$, and a linear or branched $C_1$–$C_4$ alkyl group containing a thiol group; and wherein $V^1$ and $V^2$ are independently selected from the group consisting of

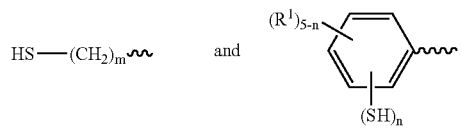

wherein, m is independently an integer from 0 to 4 with the proviso that m can=0 only when Y=

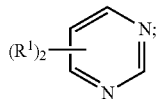

n is an integer from 1 to 5; p is an integer of from 1 to 4, and (c) at least one organic solvent;

wherein the amount of the compound of Structure VI present in the composition is effective to inhibit residue from forming when a photosensitive composition is coated on a substrate and the resulting coated substrate is subsequently processed to form an image on the substrate with the proviso that if the polybenzoxazole precursor polymer solely consists of polybenzoxazole precursor polymers that do not contain a photoactive moiety in the polymer, then (d) at least one photoactive compound is also present in the composition.

2. A photosensitive composition according to claim 1 comprising a positive photosensitive resin composition wherein the polybenzoxazole precursor polymer comprises:

at least one polybenzoxazole precursor polymer having the structure selected from the group consisting Structure I, II, III*, IV or IV*, and V, wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group which may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1$ $(OH)_2$ and $Ar^2$, x is from about 10 to about 1000; y is from 0 to about 900; D is selected from the group consisting of one of the following moieties:

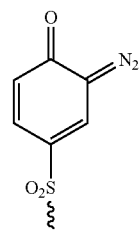

D-1

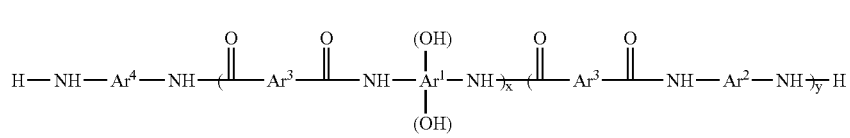

I

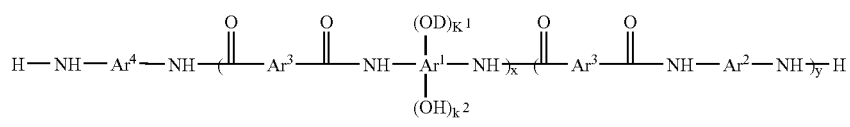

II

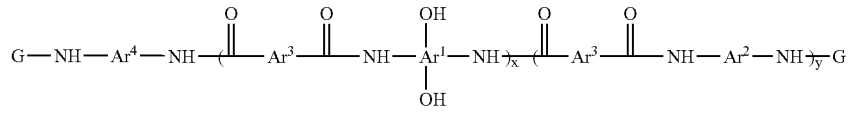

III

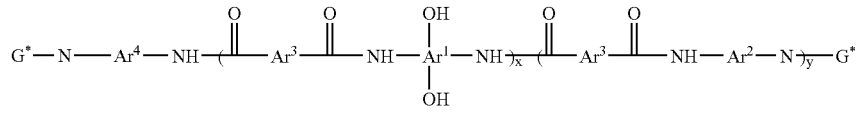

III*

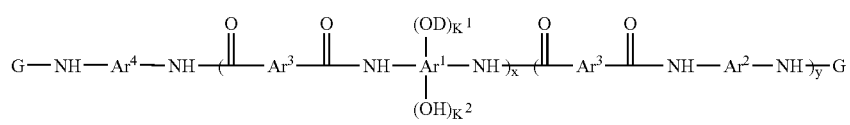

IV

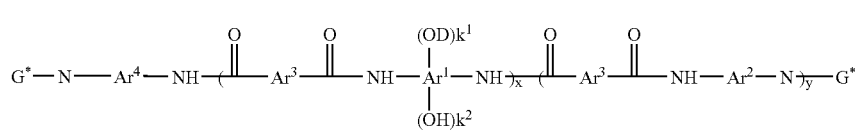

IV*

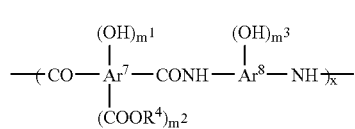

V

-continued

D-2

D-3

D-4

D-5 wherein, R is selected from the group consisting of H, halogen, a $C_1$–$C_4$ alkyl group, a $C_1$–$C_4$ alkoxy group, cyclopentyl, and cyclohexyl; $k^1$ is any positive value of up to about 0.5, $k^2$ is any value from about 1.5 to about 2 with the proviso that $(k^1+k^2)=2$, G is a monovalent organic group having a carbonyl, carbonyloxy or sulfonyl group, G* is a divalent organic group having at least one carbonyl or sulfonyl group; $Ar^7$ is a bivalent to octavalent organic group with at least two carbon atoms, $Ar^8$ is a bivalent to hexavalent organic group with at least two carbon atoms, and $R^4$ selected from the group consisting of hydrogen and an organic group with 1 to 10 carbons, $m^1$ and $m^3$ are integers in the range of 0 to 4 but $m^1$ and $m^3$ cannot be simultaneously 0 and $m^2$ is an integer in the range of 0 to 2.

3. A positive photosensitive resin composition according to claim 2 wherein the compound having structure VI is selected from the group consisting of

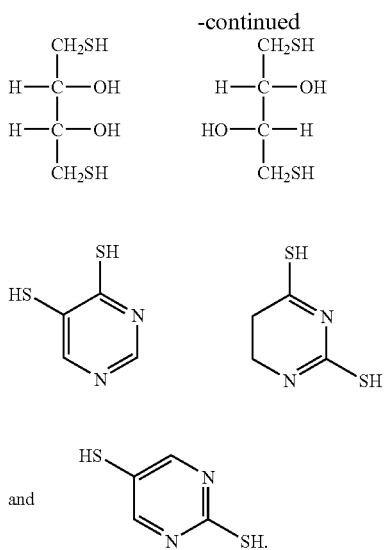

4. A positive photoresist composition according to claim 2 wherein the component of structure VI is selected from the group consisting of

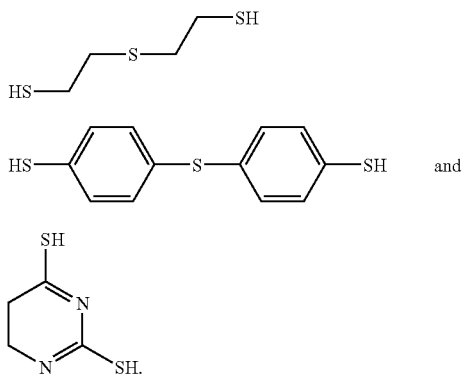

5. A positive photosensitive composition according to claim 1 additionally comprising an adhesion promoter.

6. A positive photosensitive composition according to claim 2 additionally comprising an adhesion promoter.

7. A positive photosensitive composition according to claim 6 wherein the adhesion promoter is a compound of structure XIV

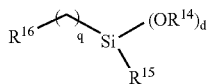
XIV wherein each $R^{14}$ is independently selected from the group consisting of a $C_1$–$C_4$ alkyl group and a $C_5$–$C_7$ cycloalkyl group, each $R^{15}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group, d is an integer from 0 to 3 and q is an integer from 1 to about 6, $R^{16}$ is selected from the group consisting of one of the following moieties:

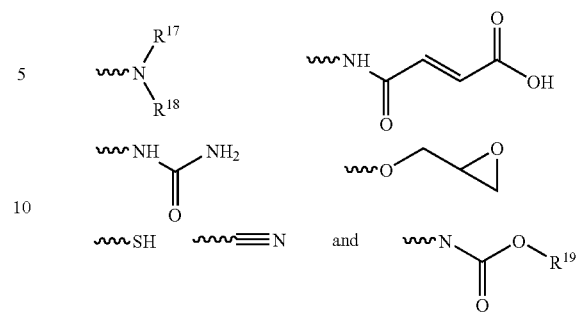

wherein each $R^{17}$ and $R^{18}$ is independently selected from the group consisting of a $C_1$–$C_4$ alkyl group and a $C_5$–$C_7$ cycloalkyl group, and $R^{19}$ is selected from the group consisting of a $C_1$–$C_4$ alkyl group or a $C_5$–$C_7$ cycloalkyl group.

8. A positive photosensitive composition according to claim 7 wherein the adhesion promoter is selected from the group consisting of

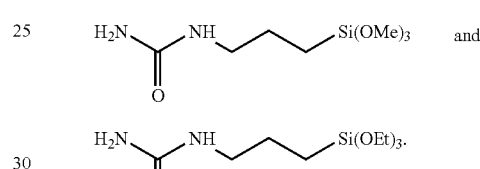

9. A process for forming a relief pattern using the positive photosensitive composition, the process comprising the steps of:
 (a) coating on a substrate, a positive-working photosensitive composition according to claim 1;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

10. A process for forming a relief pattern using the positive photosensitive composition, the process comprising the steps of:
 (a) coating on a substrate, a positive-working photosensitive composition according to claim 2;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

11. A process for forming a relief pattern using the positive photosensitive composition, the process comprising the steps of:
 (a) coating on a substrate, a positive-working photosensitive composition according to claim 3;
 (b) prebaking the coated substrate;

(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

12. A process for forming a relief pattern using the positive photosensitive composition, the process comprising the steps of:
 (a) coating on a substrate, a positive-working photosensitive composition according to claim 4;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

13. The process according to claim 9 wherein prior to step (a) the substrate is precoated with a solvent containing an adhesion promoter.

14. A relief image on a substrate formed by the process of claim 9.

15. A relief image on a substrate formed by the process of claim 10.

16. A relief image on a substrate formed by the process of claim 11.

17. A relief image on a substrate formed by the process of claim 12.

18. A relief image on a substrate formed by the process of claim 13.

* * * * *

UNITED STATES PATENT AND TRADEMARK OFFICE
CERTIFICATE OF CORRECTION

PATENT NO. : 7,220,520 B2
APPLICATION NO. : 11/445764
DATED : May 22, 2007
INVENTOR(S) : Ahmad A. Naiini Page 1 of 2

It is certified that error appears in the above-identified patent and that said Letters Patent is hereby corrected as shown below:

Column 19

Lines 55-60, delete " 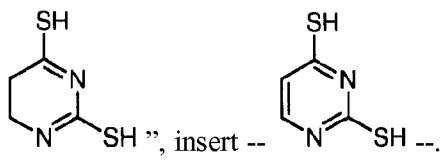 ", insert -- 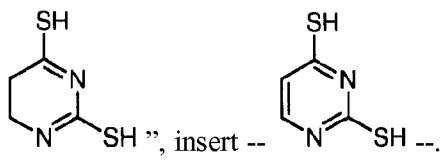 --.

Column 49

Lines 20-30, delete " 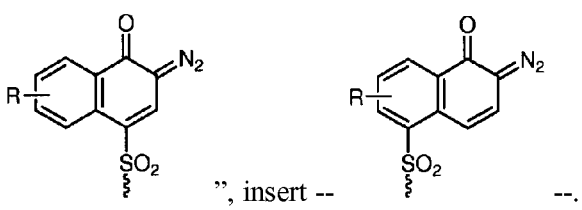 ", insert -- 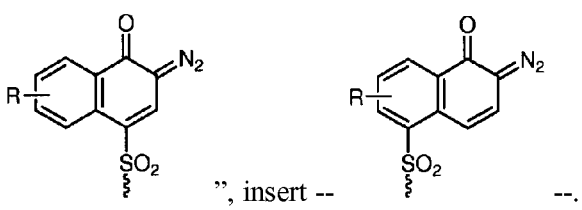 --.

Lines 30-40, delete " 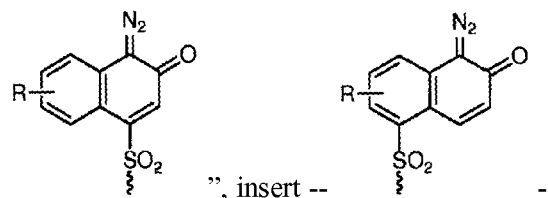 ", insert -- 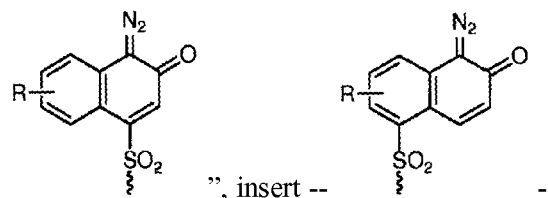 --.

Line 53, after $R^4$ insert -- is --.

Column 51

Lines 10-15, delete " 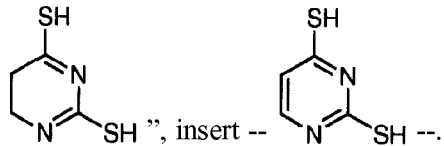 ", insert -- 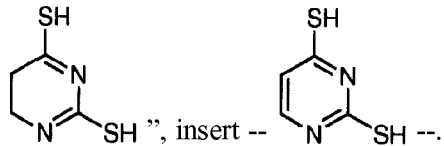 --.

UNITED STATES PATENT AND TRADEMARK OFFICE
CERTIFICATE OF CORRECTION

PATENT NO. : 7,220,520 B2  
APPLICATION NO. : 11/445764  
DATED : May 22, 2007  
INVENTOR(S) : Ahmad A. Naiini It is certified that error appears in the above-identified patent and that said Letters Patent is hereby corrected as shown below:

Line 40, delete " 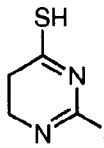 ", insert -- 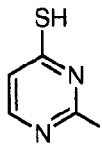 --.

Signed and Sealed this

Twenty-first Day of October, 2008

JON W. DUDAS  
*Director of the United States Patent and Trademark Office*